(12) United States Patent
Moreira et al.

(10) Patent No.: US 11,929,299 B2
(45) Date of Patent: Mar. 12, 2024

(54) HIGH-POWER DIE HEAT SINK WITH VERTICAL HEAT PATH

(71) Applicants: QUALCOMM Technologies, Inc., San Diego, CA (US); RF360 Europe GmbH, Munich (DE)

(72) Inventors: Jose Moreira, Munich (DE); Markus Valtere, Bavaria (DE); Bart Kassteen, Helden (NL); Alberto Jose Teixeira De Queiros, Munich (DE)

(73) Assignee: QUALCOMM INCORPORATED, San Diego, CA (US)

( * ) Notice: Subject to any disclaimer, the term of this patent is extended or adjusted under 35 U.S.C. 154(b) by 234 days.

(21) Appl. No.: 17/313,412

(22) Filed: May 6, 2021

(65) Prior Publication Data

US 2022/0359338 A1  Nov. 10, 2022

(51) Int. Cl.
| H01L 23/367 | (2006.01) |
| H01L 21/56 | (2006.01) |
| H01L 23/373 | (2006.01) |
| H01L 23/522 | (2006.01) |
| H05K 1/02 | (2006.01) |
| H01L 21/60 | (2006.01) |
| H01L 23/00 | (2006.01) |
| H03F 3/213 | (2006.01) |

(52) U.S. Cl.
CPC ............ *H01L 23/367* (2013.01); *H01L 21/56* (2013.01); *H01L 23/3736* (2013.01); *H01L 23/5226* (2013.01); *H05K 1/0206* (2013.01); *H01L 2021/60007* (2013.01); *H01L 23/3675* (2013.01); *H01L 24/25* (2013.01); *H03F 3/213* (2013.01)

(58) Field of Classification Search
CPC ... H01L 23/367; H01L 21/56; H01L 23/3736; H01L 23/5226; H01L 2021/60007; H01L 23/49816; H01L 24/13; H01L 24/16; H01L 23/13; H01L 23/3121; H01L 23/36; H01L 23/3677; H01L 23/3675; H01L 24/25; H05K 1/0206; H05K 1/141; H03F 3/213

See application file for complete search history.

(56) References Cited

U.S. PATENT DOCUMENTS

| 7,638,418 | B2 | 12/2009 | Bauer et al. |
| 9,269,887 | B1 * | 2/2016 | Juskey ................ H01L 23/5383 |
| 9,666,502 | B2 * | 5/2017 | Chen ................ H01L 21/76831 |
| 10,867,879 | B2 | 12/2020 | Yu et al. |
| 2007/0210457 | A1 | 9/2007 | Lin et al. |
| 2012/0038047 | A1 * | 2/2012 | Do ......................... H01L 24/19 |
| | | | 438/126 |

(Continued)

OTHER PUBLICATIONS

International Search Report and Written Opinion—PCT/US2022/071577—ISA/EPO—dated Jul. 19, 2022.

*Primary Examiner* — Patricia D Valenzuela
(74) *Attorney, Agent, or Firm* — Muncy, Geissler, Olds & Lowe, P.C.

(57) ABSTRACT

Disclosed are apparatuses and methods for fabricating the apparatuses. In one aspect, an apparatus includes a high-power die mounted on a backside of a package substrate. A heat transfer layer is disposed on the backside of the high-power die. A plurality of heat sink interconnects is coupled to the heat transfer layer, where each of the plurality of heat sink interconnects is directly coupled to the heat transfer layer in a vertical orientation.

30 Claims, 13 Drawing Sheets

(56) References Cited

U.S. PATENT DOCUMENTS

| | | | |
|---|---|---|---|
| 2016/0133584 A1* | 5/2016 | Mischitz | H01L 24/05 |
| | | | 257/762 |
| 2019/0067244 A1* | 2/2019 | Chen | H01L 24/80 |
| 2020/0006196 A1* | 1/2020 | Lin | H01L 23/3675 |
| 2020/0111734 A1* | 4/2020 | Lin | H01L 23/5385 |
| 2020/0411405 A1 | 12/2020 | Kim et al. | |
| 2022/0359337 A1 | 11/2022 | Moreira et al. | |

\* cited by examiner

HIGH-POWER DIE HEAT SINK WITH VERTICAL HEAT PATH

BACKGROUND OF THE DISCLOSURE

1. Field of the Disclosure

Aspects of the disclosure relate generally to semiconductor devices including electronic devices incorporating the semiconductor devices, and more specifically, but not exclusively, to high-power dies, power amplifier modules and related devices and fabrication techniques thereof.

2. Background

Integrated circuit technology has achieved great strides in advancing computing power through miniaturization of active components. The various packaging technologies such as flip-chip devices can be found in many electronic devices, including processors, servers, radio frequency (RF) integrated circuits, etc. Flip-chip packaging technology becomes cost-effective in high pin count devices. Advanced packaging and processing techniques allow for system in package (SiP) devices, which. may include multiple function blocks, with each function block designed to perform a specific function, such as, for example, a microprocessor function, a graphics processing unit (GPU) function, RF Front End (RFFE) function, a communications function (e.g., Wi-Fi, Bluetooth, and other communications), and the like.

The increasing number of bands and CA (carrier-aggregation) combinations to be supported in new RF technology leads to increased complexity and number of components to be integrated in the RFFE modules. This in turn puts a pressure to improve the integration techniques, in order to limit the size of the module. Limiting the size of the module impacts not only the area occupied by the RFFE modules in the mobile device, but also reduces the length of the connections inside RFFE modules itself, i.e., longer connections degrade performance. Consequently, package substrates with double-sided mounting have started to be developed. In traditional package substrates, the components (power amplifiers (Pas), switches, filters, etc.) are all mounted on the top side of the package substrate (which is the core of the RFFE modules). The bottom side is reserved for the pads, i.e., the connections to the PCB. In double-sided package substrates, some components are mounted on the bottom side of the package substrate. In all cases the PA is mounted on the top side of the package substrate. Top-side mounting leads to all package substrate layers under the PA die being used for heat sink towards the PCB. Effectiveness of the heat sink is limited by the thermal conductivity of the via holes through the package substrate. Additionally, this design leads to large keep out spaces and reduced routing flexibility.

Accordingly, there is a need for systems, apparatuses and methods that overcome the deficiencies of conventional power amplifier modules, RFFE modules and high-power SiP designs including the methods, systems and apparatuses provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus comprises: a high-power die mounted on a backside of a package substrate; a heat transfer layer disposed on the backside of the high-power die; and a plurality of heat sink interconnects coupled to the heat transfer layer, where each of the plurality of heat sink interconnects is directly coupled to the heat transfer layer in a vertical orientation.

In an aspect, a method for fabricating an apparatus comprises: mounting a high-power die on a backside of a package substrate; depositing a heat transfer layer on the backside of the high-power die; and forming a plurality of heat sink interconnects coupled to the heat transfer layer, where each of the plurality of heat sink interconnects is directly coupled to the heat transfer layer in a vertical orientation.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
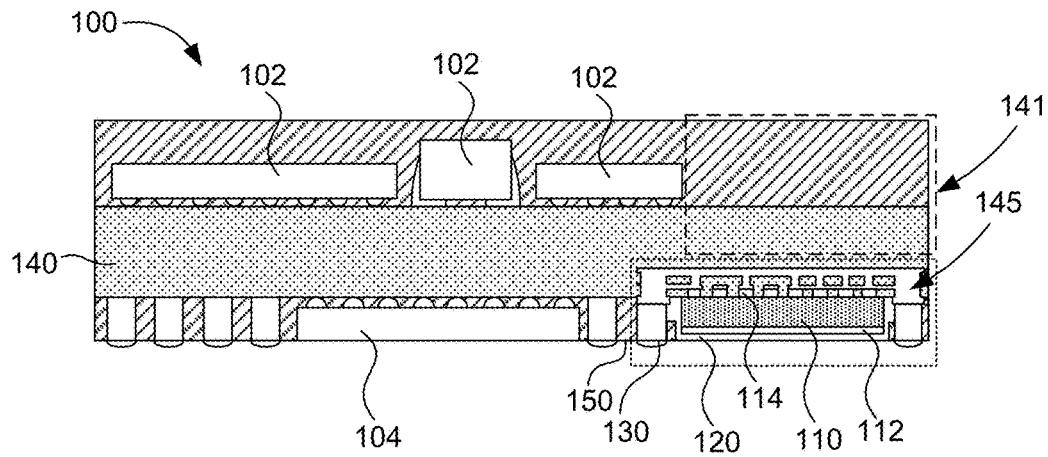
FIGS. 1A-D illustrate a partial cross-sectional view of a system in package (SiP) in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As discussed above, RFFE modules can include various components including PAMiDs (Power Amplifier Modules with integrated Duplexers) which can bring together in a single package PAs, multiplexers, filters, RF switches and LNAs to allow for highly integrated transmit and receive chains in the RFFE. Further, this allows for improved envelope tracking for enhanced RF performance while helping to reduce the manufacturer's time-to-launch new products/technology. Advanced PAMiDs can support 5G multi-band, multimode operation.

As noted above, the increasing number of bands and CA (carrier-aggregation) combinations to be supported leads to increased complexity and number of components to be integrated in the RFFE modules. In traditional package substrate designs, the components (PAs, switches, filters, etc.) are mounted on the top side of the laminate/package substrate (which is the core of the RFFE module). The bottom side is reserved for the pads, i.e., the connections to the PCB. In double-sided package substrates, some components are mounted on the bottom side of the package substrate.

In double-sided package substrates, the PAs are normally mounted on the top side. This is due to the high heating generated by the PAs. The heat generated must be effectively dissipated, in order to avoid overheating of the PAMiD. Normally a heat sink is connected directly under the PA, driving as much heat as possible vertically through the package substrate towards the ground planes in the PCB. The effectiveness of the heat sink depends on its thermal conductivity: it should be as large and short as possible and consisting of materials with high thermal conductivity—the density of the bumps and via-holes should be high.

The PA dies can be electrically connected to the package substrate through bond wires or through bumps (e.g., solder bumps or copper pillars). Ground connections can be used for thermal dissipation. Bumps are generally more suitable than bond wires for heat transfer due to lower thermal resistance. Three mounting techniques are conventionally used for PA dies:

(i) Flip-chip, where connections to the package substrate are provided through bumps
(ii) Bond-wire and backside ground bumps, where ground is connected through substrate vias to the backside of the die and then through bumps to the package substrate. The remaining connections are done through bond wires. Alternatively, instead of backside bumps, a conductive paste can be used to attach the backside ground to the package substrate. With the substrate via technique, which is frequently employed in GaAs PAs, the die can be ground down to 50-100 um thickness, which allows very short ground connections.
(iii) Same as (ii) but without bond wires. Signals are connected to the backside of the die through so called hot vias. It will be appreciated that this technique is equivalent to (i), except that the die is not flipped when mounted on the package substrate.

However, as noted above, the PA is mounted on the top side (front side) of the package substrate. Top-side mounting leads to the package substrate layers under the PA die being used as a heat sink path for heat conduction towards the PCB, which results in these portions being a keep out region for other uses. The effectiveness of the heat sink is limited by the thermal conductivity of the via holes through the package substrate.

Mounting the PA die on the bottom side would normally result in less effective heat sinking since the heat would have to flow up to the package substrate, then to the sides of the PA die and then down to the PCB. Large heat sinking paths would reduce the available space for the PA signal paths. Using bond wires for PA signal connections help to resolve this conflict but it would normally not be feasible due to insufficient height between package substrate and printed circuit board (PCB).

In various aspects disclosed, bottom-side mounting can be used with direct heat sinking towards the PCB. This includes a PA to PCB connection with low thermal resistivity. The bottom-side mounting and attaching of the PA both to the package substrate and to the PCB is likely to expose the PA die to stronger external mechanical loads, which may cause premature reliability failure of the PA. Accordingly, the various aspects disclosed herein also allow for a mechanically flexible connection of the PA die to the PCB, as well as greater heat extraction with reduced area when compared to conventional designs.

The various aspects disclosed include specific illustrations of a PA die mounted on a RFFE module, however, it will be appreciated that the various aspects may be applied to any high-power die, including, e.g., high-power RF components such as bulk acoustic wave (BAW) and surface acoustic wave (SAW) filters. Accordingly, the terms used herein such as "PA die" should be construed to also include any high-power die. As used herein the term "high-power die" generally refers to any die where heat sinking is used and, in some aspects, include dies with a 0.25 Watts or greater power dissipation rating.

In the various aspects disclosed herein, the PA die can be mounted on the bottom side of the package substrate. An effective heat sink can be coupled directly to the PCB, freeing up the area in the package substrate above the PA die. Additionally, the various aspects, allow for improved RF performance, as discussed below.

FIG. 1A illustrates a partial cross-sectional view of a system in package (SiP) 100 in accordance with one or more aspects of the disclosure. In one or more aspects, as illustrated, the SiP 100 can be an RFFE. The SiP 100 may include one or more top side components 102, which may include various dies, surface mount devices, integrated passive devices, and the like. Likewise, in addition to the PA die 110, the SiP 100 may include one or more bottom side components 104, which may include various dies, surface mount devices, integrated passive devices, and the like. In some aspects, the PA die 110 is flip-chip mounted to the bottom side of the package substrate 140. Hence, the backside (or bottom) of the PA die 110 faces the PCB (not illustrated), whereas the frontside (or top) faces the package substrate 140. It will be appreciated that the terms "backside", "bottom", "frontside", "top", and the like are used merely for convenience and the orientation may be changed in various designs and is not intended to limit the aspects disclosed herein to a specific orientation. The PA die 110 signals and ground are connected to the package substrate by frontside contacts 114, which may be top-side bumps or metal pillars. Heat sinking is conducted mainly through the backside of the PA die 110 towards the PCB, through heat sink interconnects 130, in order to provide an effective heat sink, which can efficiently extract the heat generated by the PA die 110 directly towards the PCB. In the illustrated configuration, the heat sink interconnects 130 are distributed around the PA die 110 in a horizontal direction around the perimeter or periphery of the PA die 110. In some aspects, the PA die 110 can be ground thin. For example, the PA die 110 may be ground to a thickness in the range of 40 um to 100 um. It will be appreciated that by mounting PA die 110 on the backside of the package substrate 140, a freed-up portion 141 of the package substrate 140 above the PA die 110 is freed of any conflict between signal and thermal connections in freed-up portion 141. As discussed above, in conventional designs with the top mounted PA dies the portion under the PA die has vias and metal layers used as a heat path to the bottom-side of the package substrate.

It will be appreciated that in some aspects, the freed-up portion 141 of the package substrate 140 above the PA die 110 can be used to attach another component, e.g. a PA mode switch, additional passive components, etc. The metal layers in the freed-up portion 141 above the PA die 110 can be used for interconnections or for integrated coils, inductors, transformers, or other components. For example, the various integrated coils, inductors and/or transformers can be used for PA matching.

In the various aspects disclosed, the effectiveness of the PA heat sink is improved as the heat transfer path from the PA die to the PCB is much shorter than conventional designs. In some aspects a portion of the package substrate 140, may be configured as a heat spreader 145. Additionally, a portion of a customer board (i.e., PCB not illustrated) may also act as a heat spreader for the PA die 110. In this way, PA die 110 self-heating decreases, which results in improved PA performance.

Further, in accordance with the various aspects disclosed, the PA die 110 heat dissipation path and heat sinking function, does not have to cross the whole package substrate 140, as in conventional designs. In conventional designs, this heat dissipation path results in heating up the package substrate and the filters and other components attached thereto. In the various aspects disclosed the additional heating of the filters, which is due to PA die 110 self-heating, decreases substantially. Therefore, the frequency drift of a filter passband due to temperature rise decreases. This is especially beneficial in bands with low duplex distance, like band 25 where there is only 15 MHz between the transmitter and receiver bands. This distance must cover the transition between passbands and stop-bands, as well as shifts due to process and temperature variations. It will be appreciated that these can consume more than half of the 15 MHz budget, putting significant pressure on the development of new filter technologies. Decreasing the budget for frequency drift due to less temperature variations allows for improvement of the filter performance at the passband (e.g., the low corner of the receiver filter's passband can be redesigned to a lower frequency). Since increased temperature normally results in frequency response drifting down, a lower temperature variation allows down-shift of the nominal low corner, resulting in lower loss in the low receiver channels.

The various aspects disclosed address fabrication issues that occur with attaching the PA die 110 both to the package substrate and to the PCB. In this configuration, during mounting to the PCB, the PA die 110 is exposed to much stronger external mechanical loads, thereby increasing the risk of premature reliability failure of the PA die 110. To mitigate this risk, the various aspects disclosed include several configurations, as discussed below.

In some aspects, the backside of the PA die 110 may be covered with a heat sink plate 112 (e.g. 20 um thick). The heat sink plate 112 may be formed from any thermally conducive material including at least one of silver, copper, gold, aluminum, titanium, nickel, alloys or stacked combinations thereof. The heat transfer layer 220 is also connected to one or more heat sink interconnects 230. The PA die 110 is surrounded by heat sink interconnects 130 (which may be configured as metal posts, pillars, or any suitable connector), which connect the package substrate 140 with the client board (PCB). The heat sink interconnects 130 are used for heat extraction. Additionally, the heat sink interconnects 130 can also function as ground connections. The heat sink plate 112 may be coated by a conductive spray (e.g., silver (Ag) spray) which forms a heat transfer layer 120 which is connected to several of the heat sink interconnects 130. The heat sink interconnects 130 are placed in direct contact with the package substrate 140, between it and the mold 150 mass. It will be appreciated that that the external mechanical loads applied will only impact the heat sink interconnects 130 and signal interconnects 160 (illustrated in FIG. 1B). The illustrated configuration significantly reduces the mechanical stress applied to the PA die 110 and improves the reliability of the PA die 110.

It will further be appreciated that the frontside contacts 114 of the PA die 110, through heat spreader 145, also act as a heat sink towards the package substrate 140. The backside heat sink plate 112 and heat transfer layer 120 act as an additional heat sink for PA die 110. In addition to the improved thermal function, another advantage of the backside heat sink plate 112 is that it provides additional mechanical stability to the PA die 110. However, it will be appreciated that in some aspects, the heat transfer layer 120 may be applied directly to the backside of the die 110. For example, a silver spray or silver coated metals could be used.

Figure 1B:
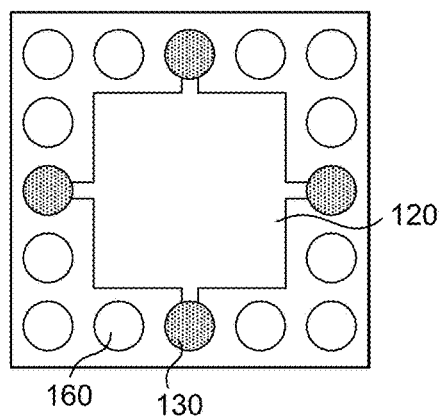

FIG. 1B illustrates a backside view of the heat transfer layer 120 and interconnects. In the illustrated configuration, there are four heat sink interconnects 130 disposed on each side of the PA die 110 (not visible) and coupled heat transfer layer 120. Signal interconnects 160 are disposed between the heat sink interconnects 130 around the perimeter of the PA die 110 and heat transfer layer 120 but are not in contact with heat transfer layer 120. Signal interconnects 160 may be used for power, ground, control signals, RF signals, digital signals, etc. Additionally, in some aspects one or more of signal interconnects 160 may not be electrically coupled to the PA die 110 or package substrate 140 and may be used to provide mechanical support. It will be appreciated that this illustration is merely provided as an example and should not be construed to limit the various aspects disclosed and claimed. For example, various aspects may include more or less heat sink interconnects 130 and signal interconnects 160 than illustrated and their locations and arrangements may be altered.

Figures 1C, 1D:
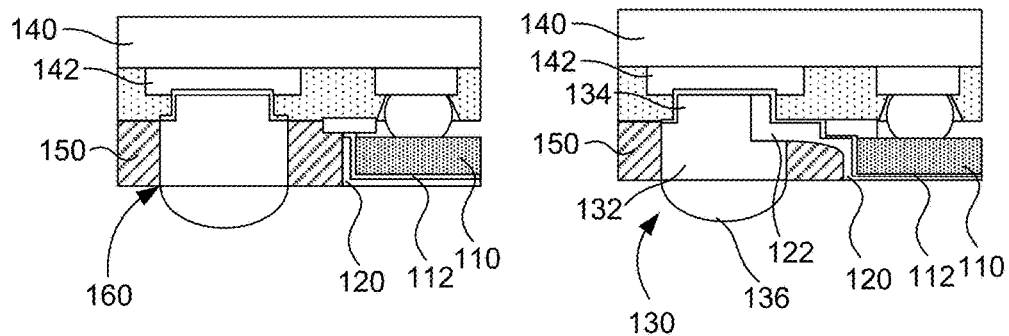

FIG. 1C illustrates a cross-sectional a signal interconnect 160. In the illustrated configuration, the signal interconnect 160 is coupled to the package substrate 140 through a pad 142. Signal interconnects 160 projects through the mold 150 to allow for connection to an external device (e.g., PCB). The mold 150 isolates the signal interconnect 160 from the heat transfer layer 120, which is disposed on the backside heat sink plate 112 coupled to the PA die 110.

FIG. 1D illustrates a cross-sectional view of a heat sink interconnect 130. In the illustrated configuration, the heat sink interconnect 130 is coupled to the package substrate 140 through pad 142. Heat sink interconnect 130 projects through the mold 150 to allow for connection to an external device (e.g., PCB). Further, heat sink interconnect 130 may include a solder portion 136 to facilitate connection to external devices. A portion of heat sink interconnect 130 is undercut and the portion 122 of the heat transfer layer 120 disposed in the undercut portion makes contact with heat sink interconnect 130. Accordingly, the heat transfer layer 120 can conduct heat from the backside heat sink plate 112 coupled to the PA die 110 to the heat sink interconnect 130.

Figure 2A:
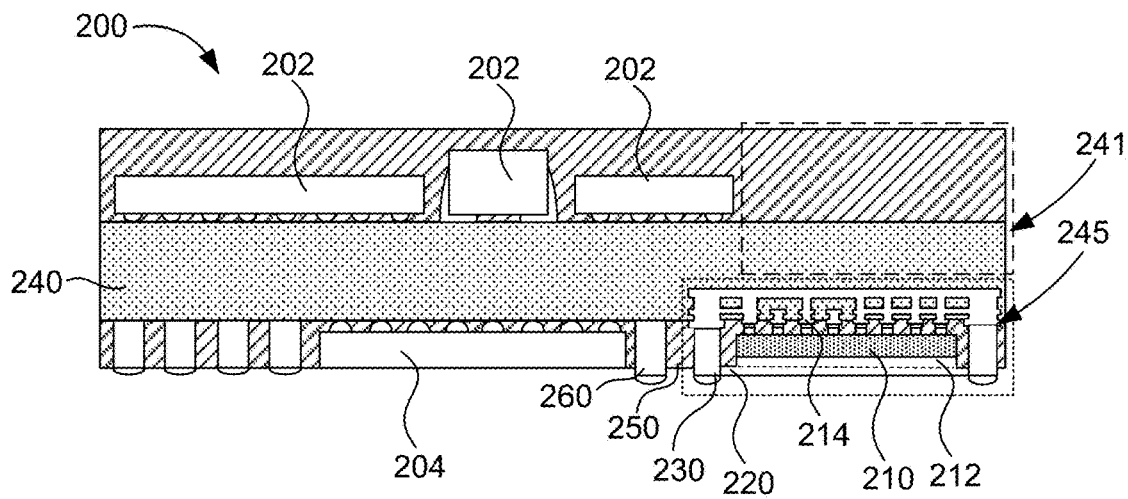
FIGS. 2A-E illustrate a partial cross-sectional view of a system in package (SiP) in accordance with one or more aspects of the disclosure.

FIG. 2A illustrates a partial cross-sectional view of a system in package (SiP) 200 in accordance with one or more aspects of the disclosure. In one or more aspects, as illustrated, the SiP 200 can be an RFFE. The SiP 200 may include one or more top side components 202, which may include various dies, surface mount devices, integrated passive devices, and the like. Likewise, in addition to the PA die 210, the SiP 200 may include one or more bottom side components 204, which may include various dies, surface mount devices, integrated passive devices, and the like. In some aspects, the PA die 210 is flip-chip mounted to the bottom side of the package substrate 240. Hence, the backside of the PA die 210 faces the PCB (not illustrated), whereas the frontside faces the package substrate 240. All signals and ground are connected to the package substrate by frontside contacts 214, which may be top-side bumps or metal pillars. Heat sinking is conducted mainly through the backside of the PA die 210 towards the PCB, through heat sink interconnects 230. In order to obtain an effective heat sink, which can efficiently extract the heat generated by the PA die 210 directly towards the PCB. In some aspects, the PA die 210 can be ground thin. For example, the PA die 210 may be ground to a thickness in the range of 40 um to 100 um. It will be appreciated that by mounting PA die 210 on the backside of the package substrate 240, a freed-up portion 241 of the package substrate 240 above the PA die 210 is freed of any conflict between signal and thermal connections in freed-up portion 241. As discussed above, in conventional designs with the top mounted PA dies the portion under the PA die has vias and metal layers used as a heat path to the bottom-side of the package substrate.

It will be appreciated that in some aspects, the freed-up portion 241 of the package substrate 240 above the PA die 210 can be used to attach another component, e.g. a PA mode switch, additional passive components, etc. The metal layers in the freed-up portion 241 above the PA die 210 can be used for interconnections or for integrated coils, inductors, transformers, etc. For example, the various integrated coils, inductors and/or transformers can be used for PA matching.

In the various aspects disclosed, the effectiveness of the PA heat sink is improved as the heat transfer path from the PA die to the PCB is much shorter than conventional designs. In some aspects a portion of the package substrate 240, may be configured as a heat spreader 245. Additionally, a portion of a customer board (i.e., PCB not illustrated) may also act as a heat spreader for the PA die 210. In this way, PA die 210 self-heating decreases, which results in improved PA performance.

Further, in accordance with the various aspects disclosed, the PA die 210 heat dissipation path and heat sinking function, does not have to cross the whole package substrate 240, as in conventional designs. In conventional designs, this heat dissipation path results in heating up the package substrate and the filters and other components attached thereto. In the various aspects disclosed the additional heating of the filters, which is due to PA die 210 self-heating, decreases substantially, which improves the frequency drift of a filter passband due, as discussed above.

The various aspects disclosed address fabrication issues that occur with attaching the PA die 210 both to the package substrate and to the PCB. In this configuration, during mounting to the PCB, the PA die 210 is exposed to much stronger external mechanical loads, thereby increasing the risk of premature reliability failure of the PA die 210. To mitigate this risk, the various aspects disclosed include several configurations, as discussed below.

In some aspects, the backside of the PA die 210 may be covered with a heat sink plate 212 (e.g., 20 um thick). The PA die 210 is surrounded by heat sink interconnects 230 (which may be configured as metal posts, pillars, or any suitable connector), which connect the package substrate 240 with the client board (PCB). The heat sink interconnects 230 are used for heat extraction. Additionally, the heat sink interconnects 230 can also function as ground connections. An optional heat sink plate 212 may be attached to the backside of the PA die 210 to allow for increased heat transfer and mechanical support. In the illustrated aspect, a heat transfer layer 220, may be metal plate, layer or film which is disposed on the backside of the PA die 210 (with or without the heat sink plate 212). The heat sink plate 212 and heat transfer layer 220 may each be formed from at least one of silver, copper, gold, aluminum, titanium, nickel, alloys or stacked combinations thereof. The heat transfer layer 220 is also connected to one or more heat sink interconnects 230. The heat sink interconnects 230 are placed in direct contact with the package substrate 240, between it and the mold 250 mass. It will be appreciated that that the external mechanical loads applied will only impact the heat sink interconnects 230 and signal interconnects 260. The illustrated configuration significantly reduces the mechanical stress applied to the PA die 210 and improves the reliability of the PA die 210, while facilitating the heat transfer from the PA die 210 to a PCB or other external component.

As discussed above, the heat transfer layer 220 and optional backside heat sink plate 212 act as heat sink for PA die 210. It will further be appreciated that the frontside contacts 214 of the PA die 210, through heat spreader 245, may also act as a heat sink for PA die 210. The heat transfer may flow from the PA die 210 towards the package substrate 240 and then be distributed through heat sink interconnects 230 from the package substrate. In addition to the improved thermal function, another advantage of the backside heat sink plate 212 is that it provides additional mechanical stability to the PA die 210. However, it will be appreciated that in some aspects, the heat transfer layer 220 may be applied directly to the backside of the die 210.

Figure 2B:
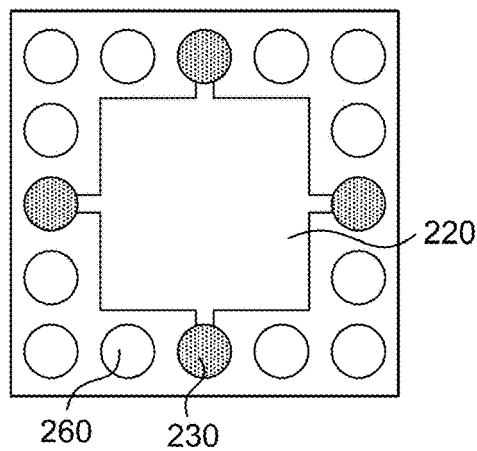

FIG. 2B illustrates a backside view of the heat transfer layer 220 and interconnects. In the illustrated configuration, there are four heat sink interconnects 230 disposed on each side of the PA die 210 (not visible) and coupled heat transfer layer 220. Signal interconnects 260 are disposed between the heat sink interconnects 230 around the heat transfer layer 220 but are not in contact with it. Signal interconnects 260 may be used for power, ground, control signals, RF signals, digital signals, etc. It will be appreciated that this illustration is merely provided as an example and should not be construed to limit the various aspects disclosed and claimed. For example, various aspects may include more or less heat sink interconnects 230 and signal interconnects 260 than illustrated and their locations and arrangements may be altered.

Figure 2C:
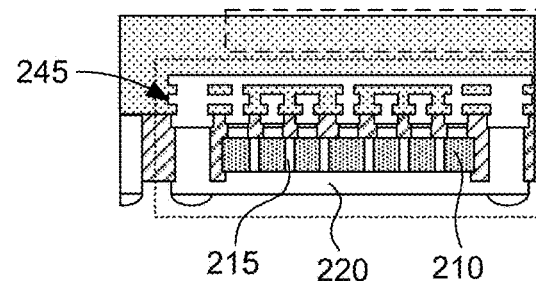

FIG. 2C illustrates a cross-sectional portion of another aspect of SiP 200. In the illustrated configuration, the PA die 210 has a plurality of heat sink vias 215 coupled between the heat transfer layer 220 (which may include the optional heat sink plate 212) the frontside of the PA die 210. In some aspects, the heat sink vias 215 may be coupled to one or more contacts on the frontside that are coupled to the heat spreader 245. It will be appreciated that the heat sink vias 215 can provide improved thermal conduction through the PA die 210. Further, although not explicitly illustrated, it will be appreciated that heat sink vias may be included in the various aspects disclosed (e.g., in PA die 110).

Figure 2D:
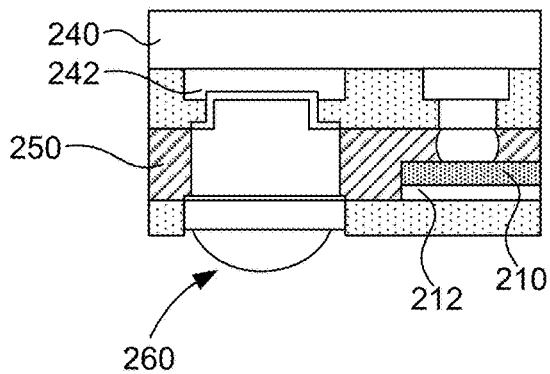

FIG. 2D illustrates a cross-sectional a signal interconnect 260. In the illustrated configuration, the signal interconnect 260 is coupled to the package substrate 240 through a pad 242. Signal interconnects 260 projects through the mold 250 to allow for connection to an external device (e.g., PCB). The mold 250 isolates the signal interconnect 260 from the backside heat sink plate 212 coupled to the PA die 210.

Figure 2E:
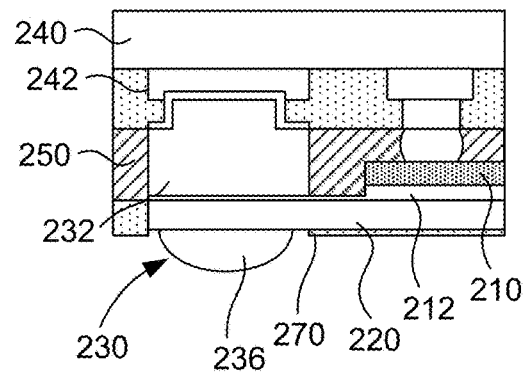

FIG. 2E illustrates a cross-sectional view of a heat sink interconnect 230. In the illustrated configuration, the heat sink interconnect 230 is coupled to the package substrate 240 through pad 242. Heat sink interconnect 230 projects through the mold 250 to allow for connection to an external device (e.g., PCB). The heat transfer layer 220 extends to make contact and form part of the heat sink interconnect 230 along with metal pillar 232, which is coupled between the heat transfer layer 220 and the pad 242. Accordingly, the heat transfer layer 220 can conduct heat from the backside heat sink plate 212 coupled to the PA die 210 to the heat sink interconnect 230. Further, heat sink interconnect 230 may include a solder portion 236 coupled to the heat transfer layer 220. The solder portion can be used for attachment to the PCB or other external device, as is known. A solder resist 270 may be disposed over and cover the backside of the heat transfer layer 220, except in the portion open for the heat sink interconnect 230. It will be appreciated that the foregoing illustrated aspects are provided merely to aid in discussion of the various aspects and the heat sink interconnect 230 is not limited to the illustrated configuration. For example, in some aspects the heat transfer layer 220 may be partially cover by solder resist or exposed.

In view of the foregoing, it will be appreciated that the various aspects disclosed can include an apparatus (e.g., SiP 100, 200). The apparatus also includes a high-power die (e.g., PA die 110, 210) mounted on a backside of a package substrate (140, 240). A heat transfer layer (e.g., 120, 220) mounted to the backside of the high-power die (e.g., 110, 210), and a plurality of heat sink interconnects (e.g., 130, 230) coupled to the heat transfer layer (e.g., 120, 220). In some aspects, it will be appreciated that the heat transfer layer (e.g., 120, 220) may also include metal plate (e.g., 112, 212) as a functional portion of the heat transfer layer. Regardless of the configuration, it will be appreciated that at least one technical advantages of the various aspects include the ability to transfer heat laterally from a backside mounted from the high-power die to provide improved performance of the SiP (100, 200), as discussed herein.

Further, aspects may include the high-power die (e.g., 110, 210) being an acoustic wave die or a power amplifier. A heat spreader (e.g., 145, 245) may be coupled to a plurality of frontside contacts (e.g., 114, 214) of the high-power die (e.g., 110, 210). The heat spreader (e.g., 145, 245) may be formed from a plurality of metal layers of the package substrate (e.g., 140, 240). The heat spreader (e.g., 145, 245) can be coupled to the plurality of heat sink interconnects (e.g., 130, 230) or a plurality of signal connectors (e.g., 160, 260) coupled to ground. The high-power die (e.g., 110, 210) may further include: a plurality of heat sink vias (e.g., 215) extending from the heat transfer layer into the high-power die. At least one of the other dies is electrically coupled to the high-power die through the package substrate. In some aspects, the plurality of heat sink interconnects (e.g., 130, 230), each may have a generally cylindrical or columnar shape. The heat transfer layer in some aspects may be formed from at least one of silver, copper, gold, aluminum, titanium, nickel, alloys or stacked combinations thereof. In some aspects, the heat transfer layer is formed from a silver paste. Each of the plurality of heat sink interconnects (130) may include: a metal pillar (132) having a recessed portion (134), where the heat transfer layer is coupled to the recessed portion of the metal pillar; and a solder portion coupled to metal pillar. The metal pillar may be copper. The mold compound is disposed adjacent the heat transfer layer, and where a backside of the heat transfer layer is disposed over the heat transfer layer is exposed from the mold compound. The heat transfer layer is formed from metal plating. Each of the plurality of heat sink interconnects (230) may include: a metal pillar (232); a portion of the heat transfer layer (220) extends over and is coupled to the metal pillar; and a solder portion (236) coupled to the portion of the heat transfer layer (220).

Figure 3A:
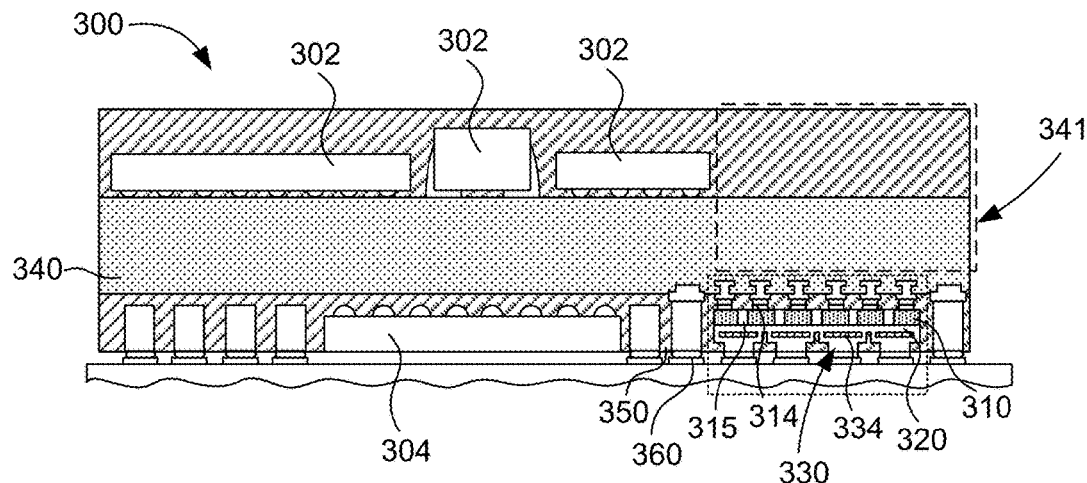
FIGS. 3A-E illustrate a partial cross-sectional view of a system in package (SiP) in accordance with one or more aspects of the disclosure.

FIG. 3A illustrates a partial cross-sectional view of a system in package (SiP) 300 in accordance with one or more aspects of the disclosure. In one or more aspects, as illustrated, the SiP 300 can be an RFFE. The SiP 300 may include one or more top side components 302, which may include various dies, surface mount devices, integrated passive devices, and the like. Likewise, in addition to the PA die 310, the SiP 300 may include one or more bottom side components 304, which may include various dies, surface mount devices, integrated passive devices, and the like. In some aspects, the PA die 310 is flip-chip mounted to the bottom side of the package substrate 340. Hence, the backside of the PA die 310 faces the PCB 380, whereas the frontside faces the package substrate 340. All signals, power and ground connections are connected to the package substrate by frontside contacts 314, which may be top-side bumps or metal pillars. Heat sinking is conducted mainly through the backside of the PA die 310 towards the PCB 380, through heat sink interconnects 330. In order to obtain an effective heat sink, which can efficiently extract the heat generated by the PA die 310 directly towards the PCB 380. In some aspects, the PA die 310 can be ground thin. For example, the PA die 310 may be ground to a thickness in the range of 40 um to 100 um. It will be appreciated that by mounting PA die 310 on the backside of the package substrate 340, a freed-up portion 341 of the package substrate 340 above the PA die 310 is freed of any conflict between signal and thermal connections in freed-up portion 341. As discussed above, in conventional designs with the top mounted PA dies the portion under the PA die has vias and metal layers used as a heat path to the bottom side of the package substrate 340.

It will be appreciated that in some aspects, the freed-up portion 341 of the package substrate 340 above the PA die 310 can be used to attach another component, e.g. a PA mode switch, additional passive components, etc. The metal layers in the freed-up portion 341 above the PA die 310 can be used for interconnections or for integrated coils, inductors, transformers, etc. For example, the various integrated coils, inductors and/or transformers can be used for PA matching.

In the various aspects disclosed, the effectiveness of the PA heat sink is improved as the heat transfer path from the PA die 310 to the PCB 380 is much shorter than conventional designs. In some aspects, a portion of a customer board (i.e., PCB 380) may also act as a heat spreader for the PA die 310. Further, in accordance with the various aspects disclosed, the PA die 310 heat dissipation path and heat sinking function, does not have to cross the whole package substrate 340, as in conventional designs. In conventional designs, this heat dissipation path results in heating up the package substrate and the filters and other components attached thereto. In the various aspects disclosed the additional heating of the filters, which is due to PA die 310 self-heating, decreases substantially, which improves the frequency drift of a filter passband due, as discussed above.

The various aspects disclosed address fabrication issues that occur with attaching the PA die 310 both to the package substrate and to the PCB. In this configuration, during mounting to the PCB, the PA die 310 is exposed to much stronger external mechanical loads, thereby increasing the risk of premature reliability failure of the PA die 310. To mitigate this risk, the various aspects disclosed include several configurations, as discussed below.

In some aspects, the backside of the PA die 310 may be covered with heat transfer layer 320. The PA die 310 may have heat sink interconnects 330 disposed vertically from the backside of the PA die 310 to the PCB 380. The heat sink interconnects 330 are used for heat extraction. Additionally, the heat sink interconnects 330 can also function as ground connections. The heat transfer layer 320 may be a heat sink plate attached directly to the backside of the PA die 310 to allow for increased heat transfer and mechanical support of the PA die 310. Alternatively, the heat transfer layer 320, may be a metal film, sputtering or the like disposed on the backside of the PA die 310. In the various aspect, the heat transfer layer 320, may be metal plate, metal layer or metal film which is disposed on the backside of the PA die 310. In some aspects, it will be appreciated that there the heat transfer layer 320 may be comprised of a heat sink plate and a conductive layer disposed over the heat sink plate. The heat transfer layer 320 may be formed from at least one of silver, copper, gold, aluminum, titanium, nickel, alloys or stacked combinations thereof. The heat transfer layer 320 is to the one or more heat sink interconnects 330. The heat sink interconnects 330 are placed in direct contact with the heat transfer layer 320 and portions of the mold 350 mass may be disposed between the heat sink interconnects 330. In this configuration, it will be appreciated that that the external mechanical loads applied will impact the heat sink interconnects 330 and signal interconnects 360. The external mechanical loads applied to heat sink interconnects 330 will also impact the PA die 310. The illustrated configuration significantly reduces the mechanical stress applied to the PA die 310 and improves the reliability of the PA die 310, by providing a compressible pad 334 in each of heat sink interconnects 330. The heat sink interconnects 330 facilitate the heat transfer from the PA die 310 to the PCB 380 or other external component. It will be appreciated that in some aspects the compressible pad may be a resilient or elastic material.

As discussed above, the heat transfer layer 320 and heat sink interconnects 330 provide heat sinking for the PA die 310. It will further be appreciated that the frontside contacts 314 of the PA die 310, in some aspects, may include a heat spreader (not illustrated). In the illustrated configuration, the PA die 310 also has a plurality of heat sink vias 315 coupled between the heat transfer layer 320. In some aspects, the heat sink vias 315 may also be coupled to one or more contacts on the frontside that are coupled to a heat spreader. It will be appreciated that the heat sink vias 315 can provide improved thermal conduction through the PA die 310. A mold compound 350 is configured to encapsulate the high-power die 310, the heat transfer layer 320 and a portion of each of the plurality of heat sink interconnects 330 along with other components of the SiP 300.

Figure 3B:
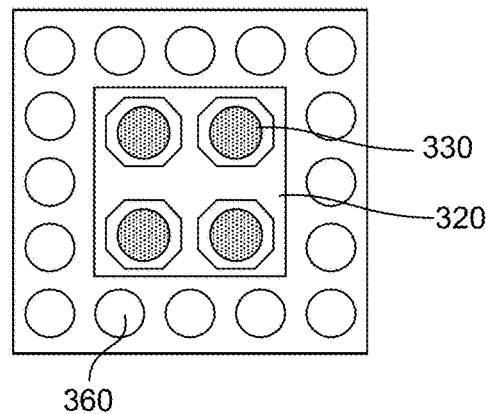

FIG. 3B illustrates a backside view of the heat transfer layer 320 and interconnects. In the illustrated configuration, there are four heat sink interconnects 330 disposed inside of on the backside of PA die 310 (not visible) and coupled heat transfer layer 320. Signal interconnects 360 are disposed between the heat sink interconnects 330 around the heat transfer layer 320 but are not in contact with it. Signal interconnects 360 may be used for power, ground, control signals, RF signals, digital signals, etc. It will be appreciated that this illustration is merely provided as an example and should not be construed to limit the various aspects disclosed and claimed. For example, various aspects may include more or less heat sink interconnects 330 and signal interconnects 360 than illustrated and their locations and arrangements may be altered.

Figures 3C, 3D, 3E:
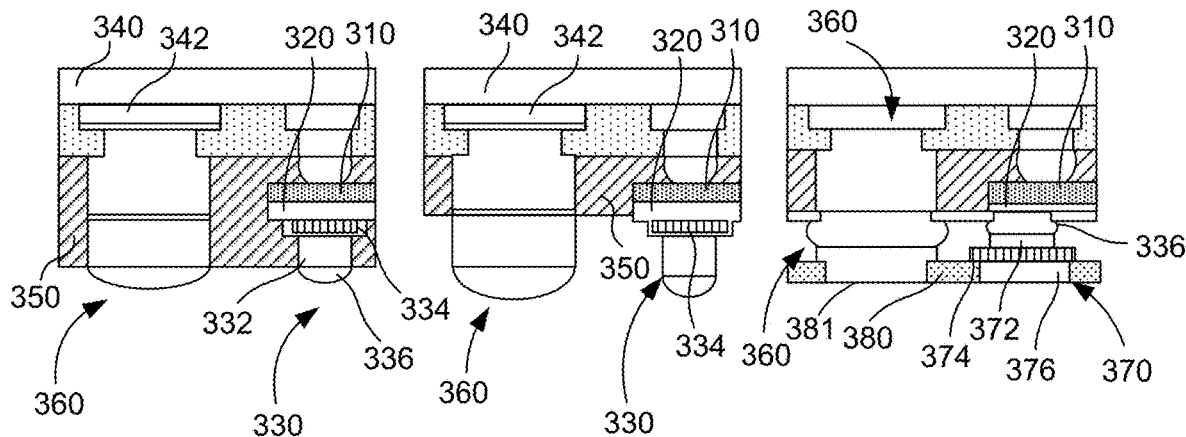

FIG. 3C illustrates a cross-sectional view of a portion of SiP 300. In the illustrated configuration, the signal interconnect 360 is coupled to the package substrate 340 through a pad 342. Signal interconnects 360 projects through the mold 350 to allow for connection to an external device (e.g., PCB). The mold 350 isolates the signal interconnect 360 from the heat sink interconnects 330 coupled to the PA die 310. Further, in the illustrated configuration, the heat sink interconnect 330 may include a metal pillar 332 coupled to a compressible pad 334 and a solder portion 336 coupled to metal pillar 332. In some aspects, the metal pillar 332 can be copper. In some aspects, the compressible pad 334 may include a polymer pad enclosed by metal. In some aspects, the compressible pad 334 may extend beyond a diameter of the metal pillar 332.

FIG. 3D illustrates a cross-sectional portion of SiP 300. In the illustrated configuration, the signal interconnect 360 is coupled to the package substrate 340 through a pad 342. In this configuration, signal interconnect 360 projects through the mold 350 and a substantial portion of the signal interconnect 360 is exposed. The mold 350 isolates the signal interconnect 360 from the heat transfer layer 320 coupled to the PA die 310. In the illustrated configuration, the mold 350 generally level with to the heat transfer layer 320, which results in a backside of the heat transfer layer 320 and the heat sink interconnect 360 being exposed from the mold 350.

FIG. 3E illustrates a cross-sectional view of a portion of SiP 300. In the illustrated configuration, signal interconnect 360 is coupled to an associated pad 381 in PCB 380. The heat sink interconnect 370 is formed from portions of PCB 380. The solder portion 336 connects the heat transfer layer 320 to a metal pillar 372 coupled to a compressible pad 374 pad 376 of PCB 380. It will be appreciated that in the illustrated configuration, the compressible pad is formed on the PCB 380. Regardless, of being formed on the PCB 380, the compressible pad 374, as part of the heat sink interconnect 370 provides a thermal connection to the backside of the heat transfer layer 320 to provide for heat sinking. Additionally, the compressible pad 374 reduces the mechanical load and stress on the PA die 310. It will be appreciated that the foregoing illustrated aspects are provided merely to aid in discussion of the various aspects and the heat sink interconnects are not limited to the illustrated configurations.

Figure 4A:
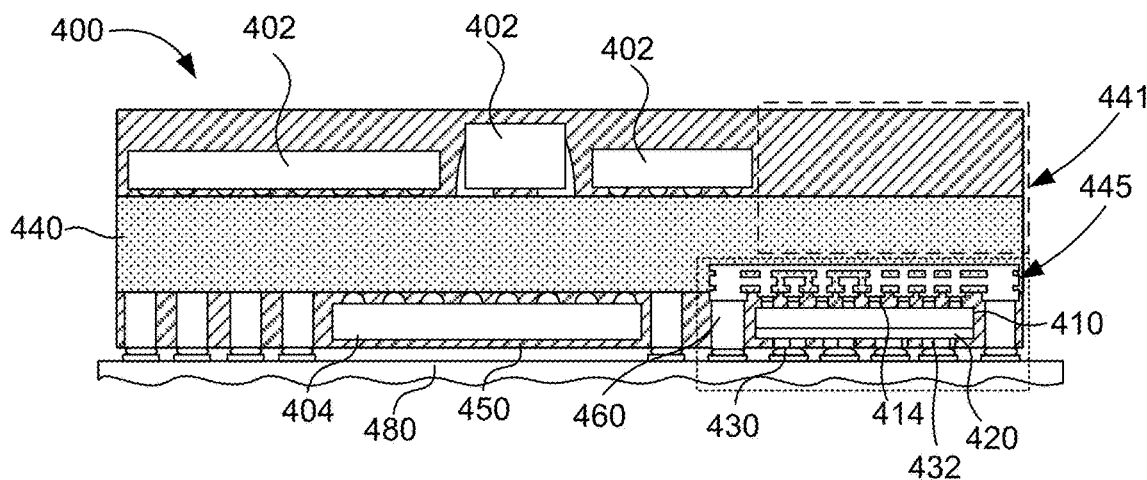
FIGS. 4A-E illustrate a partial cross-sectional view of a system in package (SiP) in accordance with one or more aspects of the disclosure.

FIG. 4A illustrates a partial cross-sectional view of a system in package (SiP) 400 in accordance with one or more aspects of the disclosure. In one or more aspects, as illustrated, the SiP 400 can be an RFFE. The SiP 400 may include one or more top side components 402, which may include various dies, surface mount devices, integrated passive devices, and the like. Likewise, in addition to the PA die 410, the SiP 400 may include one or more bottom side components 404, which may include various dies, surface mount devices, integrated passive devices, and the like. In some aspects, the PA die 410 is flip-chip mounted to the bottom side of the package substrate 440. Hence, the backside of the PA die 410 faces the PCB 480, whereas the frontside faces the package substrate 440. All signals, power and ground connections are connected to the package substrate by frontside contacts 414, which may be top-side bumps or metal pillars. Heat sinking is conducted mainly through the backside of the PA die 410 towards the PCB 480, through heat sink interconnections 430. In order to obtain an effective heat sink, which can efficiently extract the heat generated by the PA die 410 directly towards the PCB 480. In some aspects, the PA die 410 can be ground thin. For example, the PA die 410 may be ground to a thickness in the range of 40 um to 100 um. It will be appreciated that by mounting PA die 410 on the backside of the package substrate 440, a freed-up portion 441 of the package substrate 440 above the PA die 410 is freed of any conflict between signal and thermal connections in freed-up portion 441. As discussed above, in conventional designs with the top mounted PA dies the portion under the PA die has vias and metal layers used as a heat path to the bottom side of the package substrate 440.

It will be appreciated that in some aspects, the freed-up portion 441 of the package substrate 440 above the PA die 410 can be used to attach another component, e.g. a PA mode switch, additional passive components, etc. The metal layers in the freed-up portion 441 above the PA die 410 can be used for interconnections or for integrated coils, inductors, transformers, etc. For example, the various integrated coils, inductors and/or transformers can be used for PA matching.

In the various aspects disclosed, the effectiveness of the PA heat sink is improved as the heat transfer path from the PA die 410 to the PCB 480 is much shorter than conventional designs. In some aspects, a portion of a customer board (i.e., PCB 480) may also act as a heat spreader for the PA die 410. Further, in accordance with the various aspects disclosed, the PA die 410 heat dissipation path and heat sinking function, does not have to cross the whole package substrate 440, as in conventional designs. In conventional designs, this heat dissipation path results in heating up the package substrate and the filters and other components attached thereto. In the various aspects disclosed the additional heating of the filters, which is due to PA die 410 self-heating, decreases substantially, which improves the frequency drift of a filter passband due, as discussed above.

The various aspects disclosed address fabrication issues that occur with attaching the PA die 410 both to the package substrate and to the PCB. In this configuration, during mounting to the PCB, the PA die 410 is exposed to much stronger external mechanical loads, thereby increasing the risk of premature reliability failure of the PA die 410. To mitigate this risk, the various aspects disclosed include several configurations, as discussed below.

In some aspects, the backside of the PA die 410 may be covered with heat transfer layer 420. The PA die 410 may have heat sink interconnects 430 disposed vertically from the backside of the PA die 410 to the PCB 480. The heat sink interconnects 430 are used for heat extraction. Additionally, the heat sink interconnects 430 can also function as ground connections. The heat transfer layer 420 may be a heat sink plate attached directly to the backside of the PA die 410 to allow for increased heat transfer and mechanical support of the PA die 410. Alternatively, the heat transfer layer 420, may be a metal film, sputtering or the like disposed on the backside of the PA die 410. In the various aspect, the heat transfer layer 420, may be metal plate, metal layer or metal film which is disposed on the backside of the PA die 410. In some aspects, it will be appreciated that there the heat transfer layer 420 may be comprised of a heat sink plate and conductive layer disposed over the heat sink plate. The heat transfer layer 420 may be formed from at least one of silver, copper, gold, aluminum, titanium, nickel, alloys or stacked combinations thereof. The heat transfer layer 420 is to the one or more heat sink interconnects 430. The heat sink interconnects 430 are placed in direct contact with the heat transfer layer 420 to facilitate a vertical heat transfer to the PCB 480. Additionally, in some aspects, portions of the mold 450 may be disposed between the heat sink interconnects 430. In the illustrated configuration, it will be appreciated that that the external mechanical loads applied will impact the heat sink interconnects 430 and signal interconnects 460. The external mechanical loads applied to heat sink interconnects 430 will also impact the PA die 410 and could potentially damage the PA die 410. However, the illustrated configuration significantly reduces the mechanical stress applied to the PA die 410 and improves the reliability of the PA die 410, by providing a compressible metal pillar 432 (in some aspects a porous metal pillar and in other aspects can be a conductive compressible and resilient material, as discussed herein) in each of heat sink interconnects 430. The heat sink interconnects 430 facilitate the heat transfer from the PA die 410 to the PCB 480 or other external component that would be coupled to the heat sink interconnects 430, due to the direct coupling to the heat transfer layer 420 and short vertical heat transfer path.

As discussed above, the heat transfer layer 420 and heat sink interconnects 430 provide heat sinking for the PA die 410. It will further be appreciated that the frontside contacts 414 of the PA die 410, in some aspects, may be coupled to a heat spreader 445. In some aspects, the mold compound 450 is configured to encapsulate the high-power die 410, the heat transfer layer 420 and a portion of each of the plurality of heat sink interconnects 430 along with other components of the SiP 400.

Figure 4B:
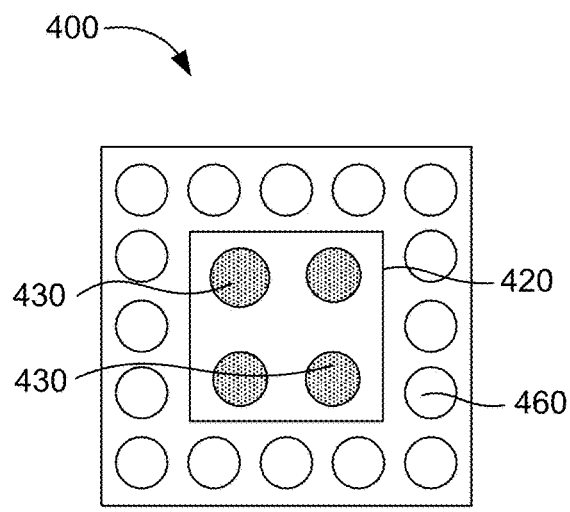

FIG. 4B illustrates a backside view of the heat transfer layer 420 and interconnects. In the illustrated configuration, there are four heat sink interconnects 430 disposed on the backside of PA die 410 (not visible) and coupled to heat transfer layer 420. Signal interconnects 460 are disposed around the heat sink interconnects 430 and the heat transfer layer 420 but are not in contact with the heat transfer layer 420. Signal interconnects 460 may be used for power, ground, control signals, RF signals, digital signals, etc. In some aspects, portions signal interconnects 460 can be used as additional heat paths (e.g., coupled to the heat spreader 445) to provide heat sinking to the PA die 410. It will be appreciated that this illustration is merely provided as an example and should not be construed to limit the various aspects disclosed and claimed. For example, various aspects may include more or less heat sink interconnects 430 and signal interconnects 460 than illustrated and their locations and arrangements may be altered.

Figure 4C:
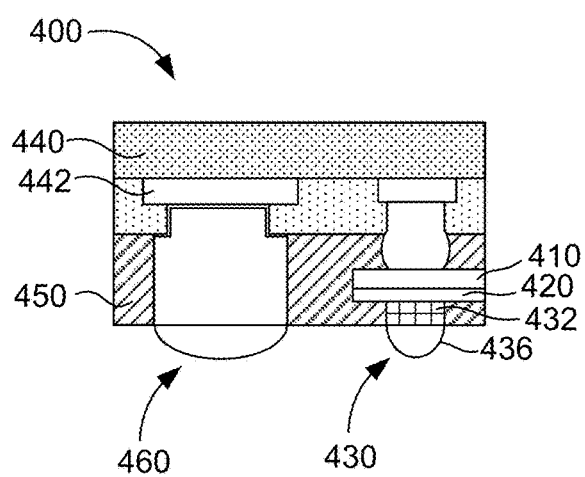

FIG. 4C illustrates a cross-sectional view of a portion of SiP 400. In the illustrated configuration, the signal interconnect 460 is coupled to the package substrate 440 through a pad 442. Signal interconnects 460 projects through the mold 450 to allow for connection to an external device (e.g., PCB). The mold 450 isolates the signal interconnect 460 from the heat sink interconnects 430 coupled to the PA die 410. Further, in the illustrated configuration, the heat sink interconnect 430 may include a compressible metal pillar 432 and a solder portion 436 coupled to the compressible metal pillar 432. In some aspects, the compressible metal pillar 432 is formed from a porous conductive material. In some aspects, the porous conductive material has a porosity of at least 4%. In some aspects, the porous conductive material has a porosity is in a range of 5% to 40%. In some aspects, the porous conductive material is a copper nano paste or a transient liquid phase sintering paste. In other aspects, it will be appreciated that regions of the transient liquid phase sintering paste may be filled with a resin and the combination of resin fill and particle size can allow the transient liquid phase sintering paste to function as a conductive compressible and resilient material that can be used as the compressible metal pillar 432, discussed herein.

Figure 4D:
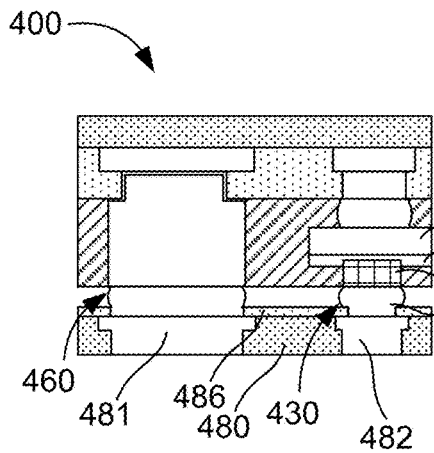

FIG. 4D illustrates a cross-sectional portion of SiP 400. In the illustrated configuration, the signal interconnect 460 is coupled to the package substrate 440 through a first PCB pad 481 and the heat sink interconnect 430 is connected to a second PCB pad 482 of PCB 480 through openings in solder resist 486. In this configuration, the heat sink interconnects 430 are coupled to the PA die 410, as discussed above. The heat sink interconnect 430 may include compressible metal pillar 432 and solder portion 436. The solder portion 436 is coupled to the compressible metal pillar 432 and the second PCB pad 482, which provides a mechanical connection and vertical thermal path from PA die 410. As illustrated, the heat from PA die 410 can flow through heat transfer layer 420 and through heat sink interconnect 430 to PCB 480.

Figure 4E:
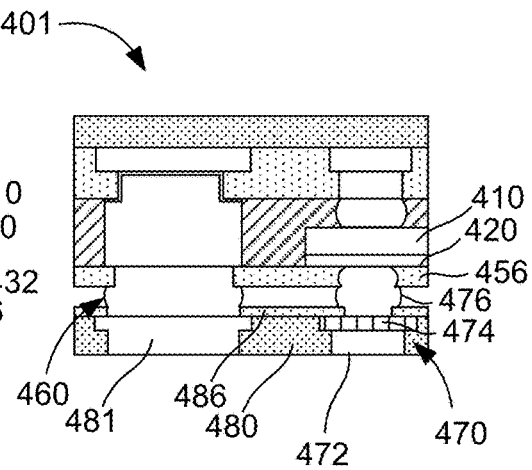

FIG. 4E illustrates a cross-sectional view of a portion of SiP 401. In the illustrated configuration SiP 401 is similar to SiP 400 discussed above, except the heat sink interconnect is configured differently, with a compressible pad in the PCB 480. Accordingly, similar elements will be labeled similarly and not all details of the SiP 401 are illustrated. The signal interconnect 460 is coupled to a first pad 481 in PCB 480 though an opening in solder resist 486. In this aspect, the heat sink interconnect 470 is formed from portions of PCB 480. A solder portion 476 connects to the heat transfer layer 420 through an opening in solder resist 456. The solder portion 476 is coupled to a compressible contact 474 of PCB 480 through an opening in solder resist 486. It will be appreciated that in the illustrated configuration, the compressible contact 474 is formed in the PCB 480 and coupled to a second PCB pad 472. Regardless, of being formed in the PCB 480, the compressible contact 474, can be considered to be part of the heat sink interconnect 470. Functionally, the heat sink interconnect 470 provides a vertical thermal connection to the backside the heat transfer layer 420 to provide for heat sinking for PA die 410. Additionally, the compressible contact 474 reduces the mechanical load and stress on the PA die 410 during the attachment to the PCB 480 and subsequent processing. As illustrated, a backside of the heat transfer layer 420 is covered by solder resist 456 and the plurality of heat sink interconnects 470 can be formed in openings in the solder resist. PCB 480 can have a plurality of compressible contacts 474 coupled to the RF die 410 through the plurality of heat sink interconnects 470. wherein each of the plurality of compressible contacts contact further comprise: a compressible pad coupled to the PCB via second PCB pad 472. In some aspects, each of the plurality of compressible contacts 474 further comprise: a compressible contact 474 embedded in the PCB 480 and covered by a solder resist 486. The compressible contact 474 is coupled to an associated heat sink interconnect. The compressible contact 474 can be formed from a porous conductive material. The porous conductive material, in some aspects, has a porosity of at least 4% and in further aspects, has a porosity in a range of 5 percent to 40 percent. In some aspects, the porous conductive material is a copper nano paste. In some aspects, the porous conductive material is a copper nano paste or a transient liquid phase sintering paste. In other aspects, the instead of the porous conductive material, the compressible contact 474 can be formed from a transient liquid phase sintering paste may be used. It will be appreciated that regions of the transient liquid phase sintering paste may be filled with a resin and the combination of resin fill and particle size can allow the transient liquid phase sintering paste to function as a conductive compressible and resilient material. Further, it will be appreciated that the foregoing illustrated aspects are provided merely to aid in discussion of the various aspects and the heat sink interconnect configurations are not limited to the illustrated examples.

Figure 5:
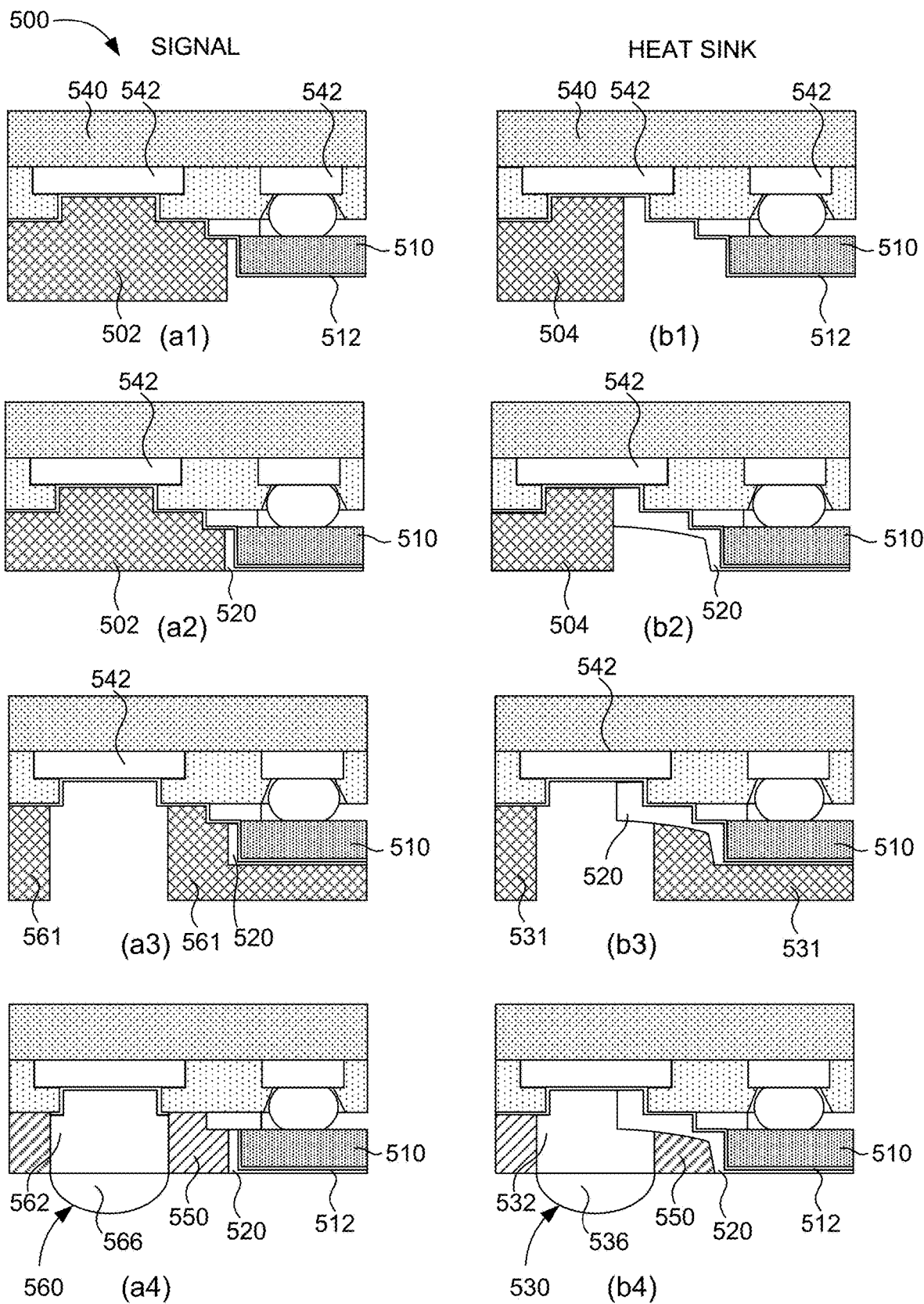
FIG. 5 illustrates a partial method for fabricating system in package (SiP) in accordance with one or more aspects of the disclosure.

FIG. 5 illustrates a fabrication processes for forming a SiP 500 in accordance with one or more aspects of the disclosure. It will be appreciated that the illustrated processes focus on forming the signal interconnects ("a" side) and heat sink interconnects ("b" side). It will be appreciated that although details of one of each respective interconnects are illustrated, the fabrication process can apply to other similar interconnects of SiP 500. Further, it will be appreciated that SiP 500 is similar to SiP 100 described above, so details of all elements will not be provided. In portions (a1) and (b1) of the process, the package substrate 540 is provided with pads 542 and the high-power die 510 is coupled to the package substrate 540 using some of pads 542. A copper seed layer 512 is deposited over the high-power die 510 and exposed pads 542 (not coupled to the high-power die 510). A dry film resist (DFR) laminating process has been performed and the DFR has been patterned and etched using Laser Direct Imaging (LDI) or any suitable process. In process portion (a1), a DFR portion 502 is formed over pads 542 for the signal interconnects. In process portion (b1), a DFR portion 504 is formed over pads 542 for the heat sink interconnects. It will be appreciated that the DFR portion 504 only covers a portion of contact pad 542 of the heat sink interconnects.

The process continues in portions (a2) and (b2) with a conductive layer being applied, e.g., by spray coating a silver (Ag) paste, over the high-power die 510. The conductive layer forms the heat transfer layer 520. The heat transfer layer 520 also extends over copper seed layer 512 to the exposed portions pads 542 in portion (b2), adjacent the DFR portion 504, for the heat sink interconnects. In process portion (a2), the DFR portion 502 blocks the heat transfer layer 520 from the pads 542 for the signal interconnects. Additionally, the spray coating can be cured and then ground and/or fly cut to remove the coated material in the raised areas.

The process continues in portions (a3) and (b3) with the stripping of the old DFR portions (502 and 504) and the depositing and patterning of DFR portion 561 in (a3) and DFR portion 531 in (b3). In process portion (a3), the DFR portion 561 forms an opening to the pads 542 for the signal interconnects and shields the adjacent die 510 and heat transfer layer 520 portions. In process portion (b3), the DFR portion 561 forms an opening to the pads 542 for the heat sink interconnects and shields the adjacent die 510 and heat transfer layer 520 portions adjacent the die 510. However, a portion of the heat transfer layer 520 disposed over part of the contacts 542 is exposed the open of the DFR portion 531.

The process continues in portions (a4) with pillars/posts 562 formed by copper plating for the signal interconnect 560 and the previous DFR portions being stripped (e.g., wet stripping). Additionally, the copper seed layer is removed (e.g., via etching). In portion (b4), the heat sink interconnect 530 pillars/posts 532 are formed by copper plating and the previous DFR portions are stripped (e.g., wet stripping). Additionally, exposed portion of the copper seed layer are removed (e.g., via etching). The heat transfer layer 520 still extends to the contact pad 542 and fills in an undercut portion of the pillar 532. In both (a4) and (b4) a mold 550 can be deposited. The backside can be ground to planarize the exposed surfaces and then a ball attached process can be performed to form solder balls 566 for the signal interconnects 560 and solder balls 536 for the heat sink interconnect 530. It will be appreciated that the final structure of SiP 500 is similar to that of SiP 100.

Figure 6:
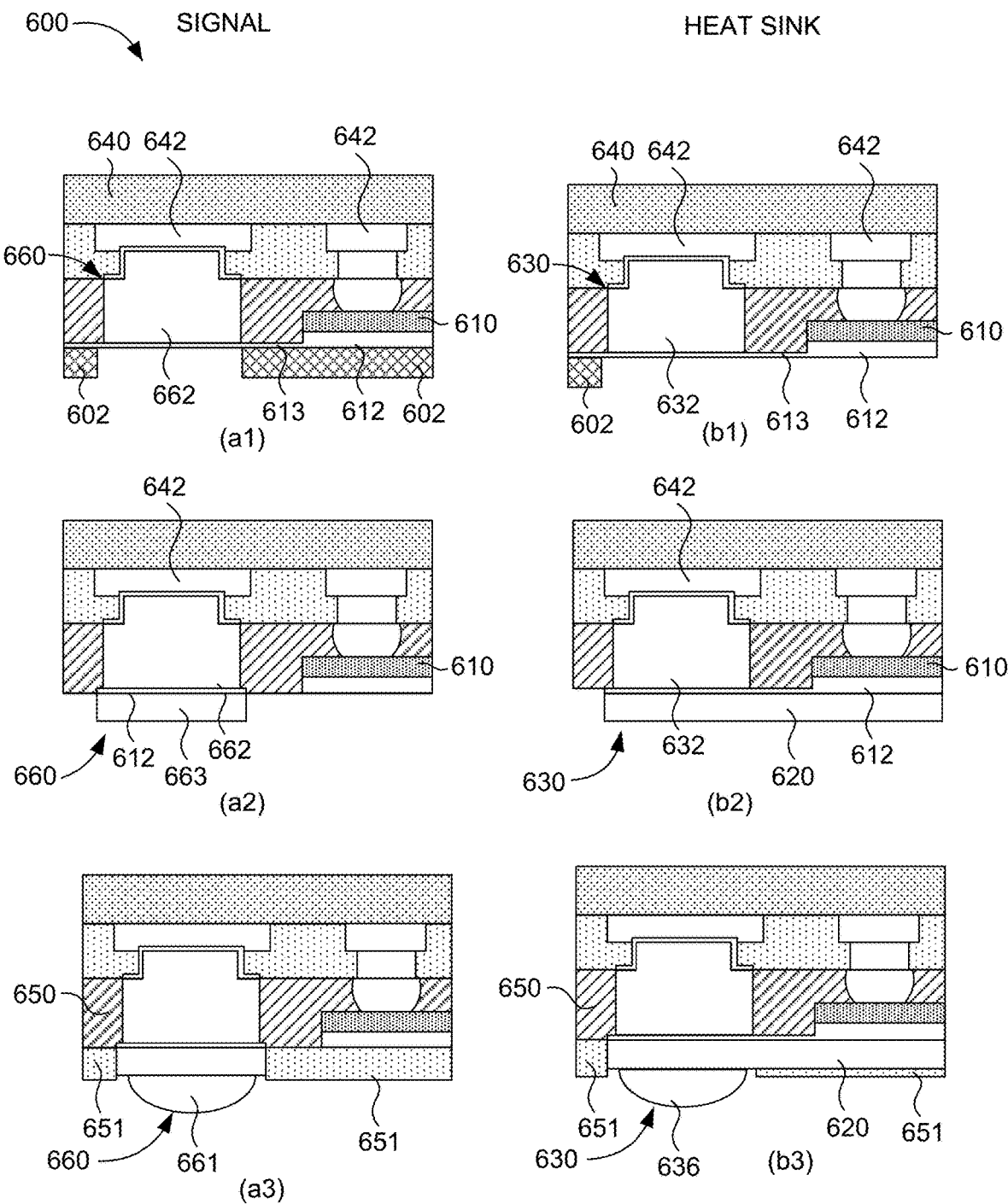
FIG. 6 illustrates a partial method for fabricating system in package (SiP) in accordance with one or more aspects of the disclosure.

FIG. 6 illustrates a fabrication processes for forming a SiP 600 in accordance with one or more aspects of the disclosure. It will be appreciated that the illustrated processes focus on forming the signal interconnects ("b" side) and heat sink interconnects ("b" side). It will be appreciated that although details of one of each respective interconnects are illustrated, the fabrication process can apply to other similar interconnects of SiP 600. Further, it will be appreciated that SiP 600 is similar to SiP 200 described above, so details of all elements will not be provided. In portions (a1) and (b1) of the process, the package substrate 640 is provided with pads 642 and the high-power die 610 is coupled to the package substrate 640 using some of pads 642. A copper seed layer 613 is deposited over the high-power die 610. In the illustrated aspect, the high-power die 610 has a heat sink plate 612, which aids in the heat transfer, but is optional as the seed layer 613 in other aspects may be applied directly to the high-power die 610. The seed layer 613 also extends over metal pillar 632, which is part of the heat sink interconnect 630 (not yet completely formed) and metal pillar 662 the signal interconnect 660 (not yet completely formed). A dry film resist (DFR) laminating process has been performed and the DFR has been patterned and etched using Laser Direct Imaging (LDI) or any suitable process to form a patterned DFR portion 602 that provides for openings over the metal pillar 662, metal pillar 632, and heat sink plate 612.

The process continues in portions (a2) and (b2) with a conductive material being applied, e.g., Cu plating, sputtering or any suitable process to the seed layer 613 in the openings defined by DFR portions 602. In portion (a2), the conductive material forms a portion 663 of the signal interconnect 660. In portion (b2), the conductive material forms the heat transfer layer 620 which extends from the metal pillar 632 to the heat sink plate 612 and high-power die 610. In process portion (a2) and (b2), the DFR portion 602 is stripped (e.g., wet stripping) after the deposition of the conductive material. Further, the exposed portions of the seed layer 613 that were under the DFR 602 are removed by etching or any suitable process.

The process continues in portions (a3) and (b3) with a solder resist 651 being applied (e.g., via printing or other suitable process) over mold compound 650 and portions of the heat transfer layer 620. The solder resist 651 has openings over the signal interconnects 660 and heat sink interconnect 630. A ball attached process can be performed to form solder balls 661 for the signal interconnects 660, in (a3) and solder balls 636 for the heat sink interconnect 630, in (b3). It will be appreciated that the final structure of SiP 600 is similar to that of SiP 200.

Figure 7:
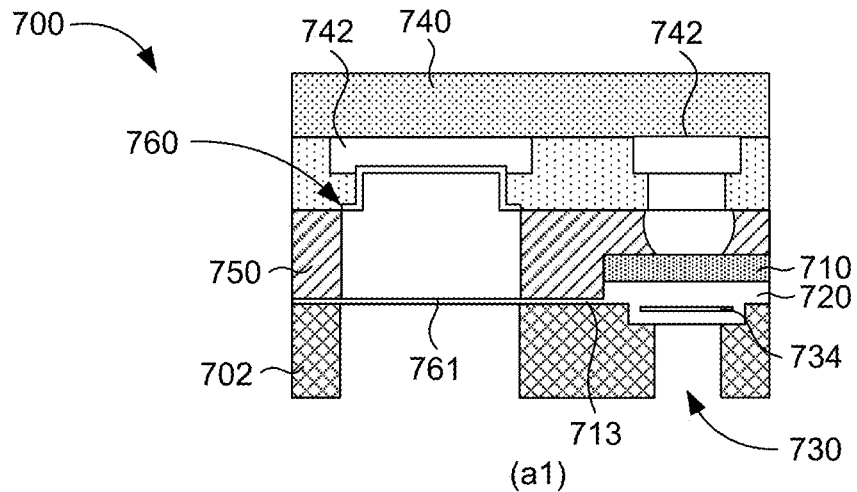
FIG. 7 illustrates a partial method for fabricating system in package (SiP) in accordance with one or more aspects of the disclosure.
Figure 7:
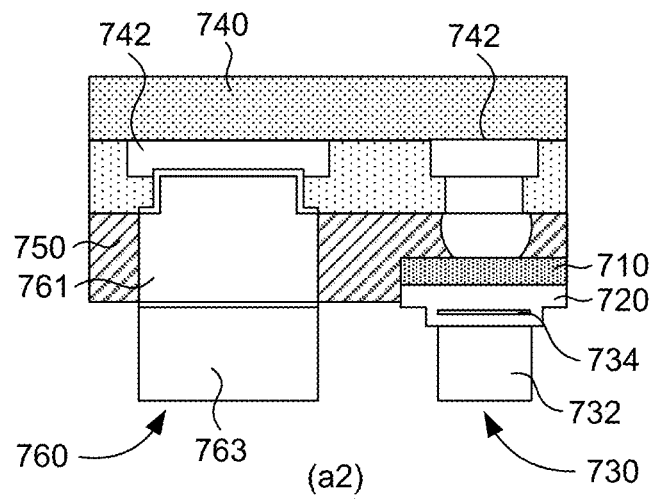
Figure 7:
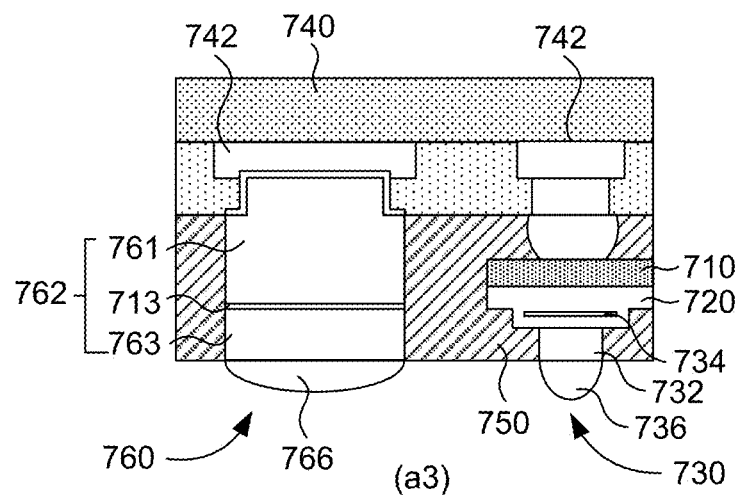

FIG. 7 illustrates a fabrication processes for forming a SiP 700 in accordance with one or more aspects of the disclosure. It will be appreciated that the illustrated processes focus on forming the signal interconnects 760 and heat sink interconnects 730. It will be appreciated that although details of one of each respective interconnects are illustrated, the fabrication process can apply to other similar interconnects of SiP 700. Further, it will be appreciated that SiP 700 is similar to SiP 300 described above, so details of all elements will not be provided. In portion (a1) of the process, the package substrate 740 is provided with pads 742 and the high-power die 710 coupled to the package substrate 740 using some of pads 742. A copper seed layer 713 is deposited over the high-power die 710. In the illustrated aspect, the high-power die 710 has a heat transfer layer 720, which may be a heat sink plate, which aids in the heat transfer, but is optional as the seed layer 713 in other aspects may be applied directly to the high-power die 710 and function as a heat transfer layer in alternative aspects. In the illustrated configuration, the signal interconnect 760 is coupled to the package substrate 740 through a pad 742. Signal interconnects 760 projects through the mold 750 and is also covered by the seed layer 713 Further, in the illustrated configuration, the heat sink interconnect 730 (may include a compressible pad 734. In some aspects, the compressible pad 734 may include a polymer pad enclosed by metal, such as copper. The seed layer 713 also extends over metal pillar portion 761 of the signal interconnect 760 (not yet completely formed). A dry film resist (DFR) laminating process has been performed and the DFR has been patterned and etched using Laser Direct Imaging (LDI) or any suitable process to form a patterned DFR portion 702 that provides for openings over the metal pillar portion 761 and the compressible pad 734.

The process continues in portion (a2) with a conductive material being applied, e.g., Cu plating, sputtering or any suitable process to the seed layer 713 in the openings defined by DFR portions 702. In portion (a2), the conductive material forms a portion 763 of the signal interconnect 760. The conductive material also forms metal pillar 732 which is coupled to the heat transfer layer 720 and high-power die 710 through the compressible pad 734 encased in metal. In process portion (a2), the DFR portion 702 has been stripped (e.g., wet stripping) after the deposition of the conductive material. Further, the exposed portions of the seed layer 713 that were under the DFR 702 are removed by etching or any suitable process.

The process continues in portions (a3) with an additional mold compound portion of being applied over the previous mold portion to form mold 750 which covers the portion 763 of the metal pillar 762 of the signal interconnect 760 and portions of the heat transfer layer 720, metal encased compressible pad 734 and metal pillar 732. It will be appreciated that this additional mold compound portion is optional, and some aspects may have the signal interconnects and extending from mold 750 (such as in FIG. 3D). A grinding process may be performed to planarize the mold and expose an end portion of metal pillar 762 and metal pillar 732. A ball attached process can be performed to form solder balls 766 for the signal interconnects 760, and solder balls 736 for the heat sink interconnects 730. It will be appreciated that the final structure of SiP 700 is similar to that of SiP 300, discussed above. Further, it will be appreciated that the various aspects are not limited to the examples provided herein. For example, it will be appreciated that the mold 750 may be formed of more or less layers than discussed herein, but functions as one mold 750 in the final product. Likewise, it will be appreciated that the metal pillar portions 761 and 763 along with seed layer 713 are illustrated as forming metal pillar 762 in the final product. If each of these layers are the same material, the resulting metal pillar 762 may appear as one continuous element. Regardless, the metal pillar 762 functions as one conductive element, so the details of the fabrication, should not be construed to limit the metal pillar 762 to the illustrated fabrication example.

Figure 8:
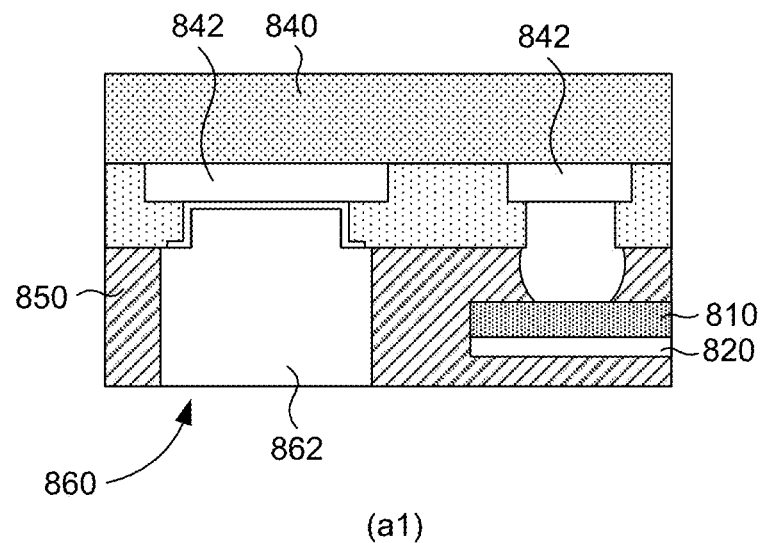
FIG. 8 illustrates a partial method for fabricating system in package (SiP) in accordance with one or more aspects of the disclosure.
Figure 8:
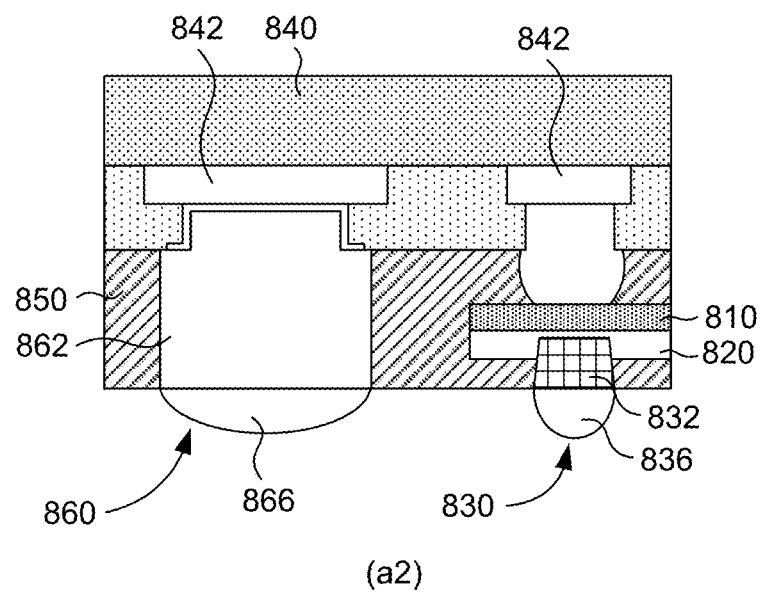

FIG. 8 illustrates a fabrication processes for forming a SiP 800 in accordance with one or more aspects of the disclosure. It will be appreciated that the illustrated processes focus on forming the signal interconnects 860 and heat sink interconnects 830. It will be appreciated that although details of one of each respective interconnects are illustrated, the fabrication process can apply to other similar interconnects of SiP 800. Further, it will be appreciated that SiP 800 is similar to SiP 400 described above, so details of all elements will not be provided. In portion (a1) of the process, it will be appreciated that that process continues similar to the process (a3) in FIG. 7, except that the heat sink interconnects 830 are not formed or the solder balls attached. Accordingly, the prior process portions will not be repeated. As illustrated, the package substrate 840 is provided with pads 842 and the high-power die 810 coupled to the package substrate 840 using some of pads 842. In the illustrated aspect, the high-power die 810 has a heat transfer layer 820, which may be a heat sink plate, or any suitable conductor to function as a heat transfer layer in alternative aspects. In the illustrated configuration, the signal interconnect 860 is coupled to the package substrate 840 through a pad 842. A grinding process has been performed to planarize the mold 850 and expose an end portion of metal pillar 862. The mold 850 also extends over the high-power die 810 and heat transfer layer 820.

The process continues in portion (a2) with a laser ablation process or any suitable process to remove portions of the mold 850 to form an array of openings to the heat sink layer 820. It will be appreciated that the heat sink layer 820 also serves as a buffer to prevent damage to the high-power die 810 during the laser ablation process. The compressible metal pillars 832 (in some aspects porous metal pillars) may be formed in the array of openings in mold 850. In the illustrated configuration, the heat sink interconnect 830 may include a compressible metal pillar 832. In some aspects, the compressible metal pillar 832 can be formed from a porous conductive material. In some aspects, the porous conductive material has a porosity of at least 4%. In some aspects, the porous conductive material has a porosity is in a range of 5% to 40%. In some aspects, the porous conductive material is a copper nano paste, which may be deposited on heat sink layer 820 by a stencil print process and cured after. After the compressible metal pillar 832 is formed, a ball attached process can be performed to form solder balls 866 attached to metal pillars 862 for the signal interconnects 860, and solder balls 836 attached to the compressible metal pillar 832 for the heat sink interconnects 830. It will be appreciated that the final structure of SiP 800 is similar to that of SiP 400, discussed above. Further, it will be appreciated that the various aspects are not limited to the fabrication examples provided herein.

To illustrate the various aspects of disclosure, example methods of fabrication are presented. Other methods of fabrication are possible and the discussed fabrication methods are presented only to aid understanding of the concepts disclosed herein.

Figure 9:
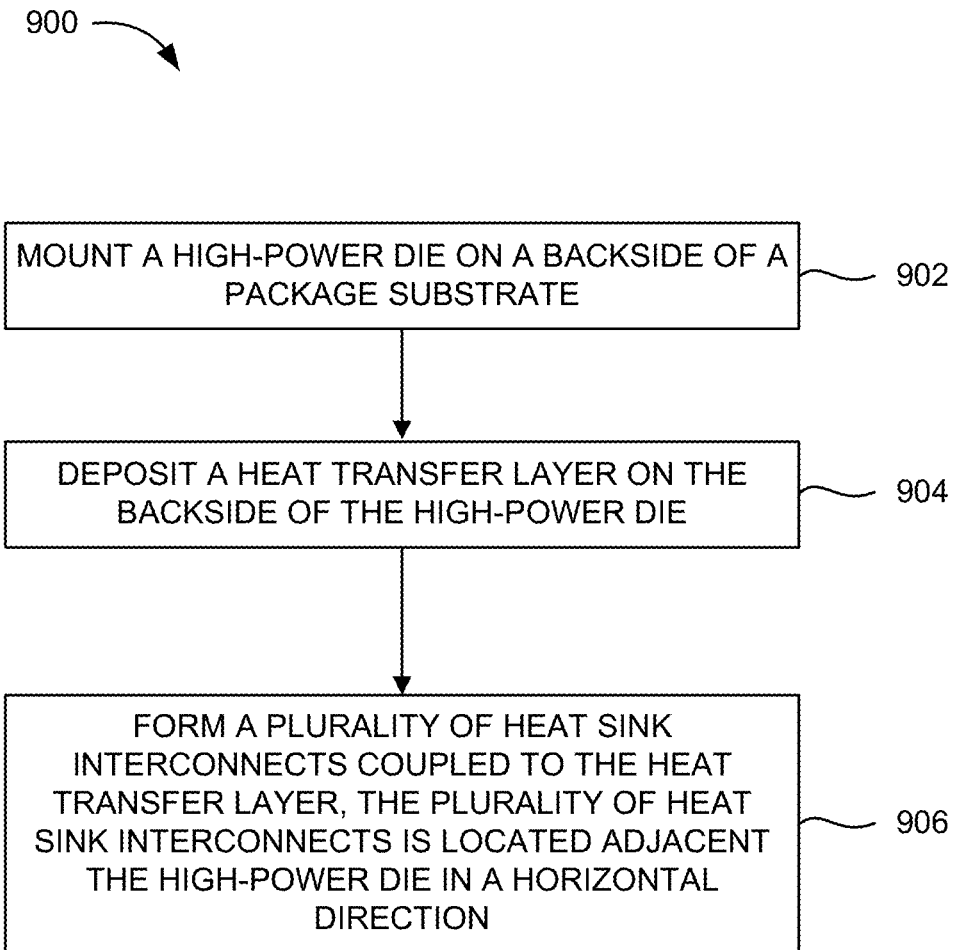
FIG. 9 illustrates a flowchart of a method for manufacturing a system in package (SiP) in accordance with one or more aspects of the disclosure.

FIG. 9 illustrates fabrication techniques in accordance with one or more aspects of the disclosure. The method 900 for fabricating an apparatus (e.g., SiP 100, 200, 300, 400, etc.) includes, in block 902, mounting a high-power die (e.g., 110, 210, 310, 410, etc.) on a backside of a package substrate (e.g., 140, 240, 340, 440, etc.). The method 900, continues in block 904, depositing a heat transfer layer (e.g., 120, 220, 320, 420, etc.) on the backside of the high-power die (e.g., 110, 210, 310, 410, etc.). The method 900, continues in block 906, with forming a plurality of heat sink interconnects (e.g., 130, 230, 330, 430, etc.) coupled to the heat transfer layer (e.g., 120, 220, 320, 420, etc.). The plurality of heat sink interconnects is located adjacent the high-power die in a horizontal direction.

Figure 10:
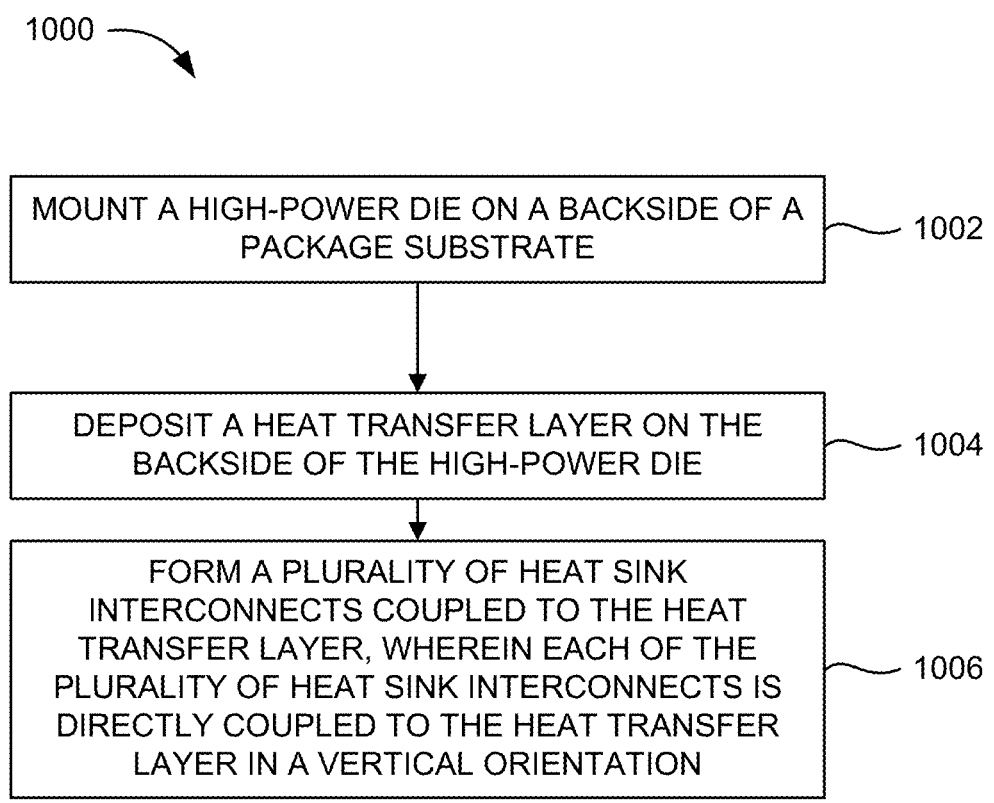
FIG. 10 illustrates a flowchart of a method for manufacturing a device in accordance with one or more aspects of the disclosure.

FIG. 10 illustrates fabrication techniques in accordance with one or more aspects of the disclosure. The method 1000 for fabricating an apparatus (e.g., SiP 300, 400, 700, and 800) includes, in block 1002, mounting a high-power die (e.g., 310, 410, 710, and 810) on a backside of a package substrate (e.g., 340, 440, 740, and 840). The method 1000, continues in block 1004, depositing a heat transfer layer (e.g., 320, 420, 720, and 820) on the backside of the high-power die (e.g., 310, 410, 710, and 810). The method 1000, continues in block 1006, with forming a plurality of heat sink interconnects (e.g., 330, 430, 730, and 830) coupled to the heat transfer layer (e.g., 320, 420, 720, and 820), where each of the plurality of heat sink interconnects is directly coupled to the heat transfer layer in a vertical orientation.

It will be appreciated that the foregoing fabrication processes were provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 11:
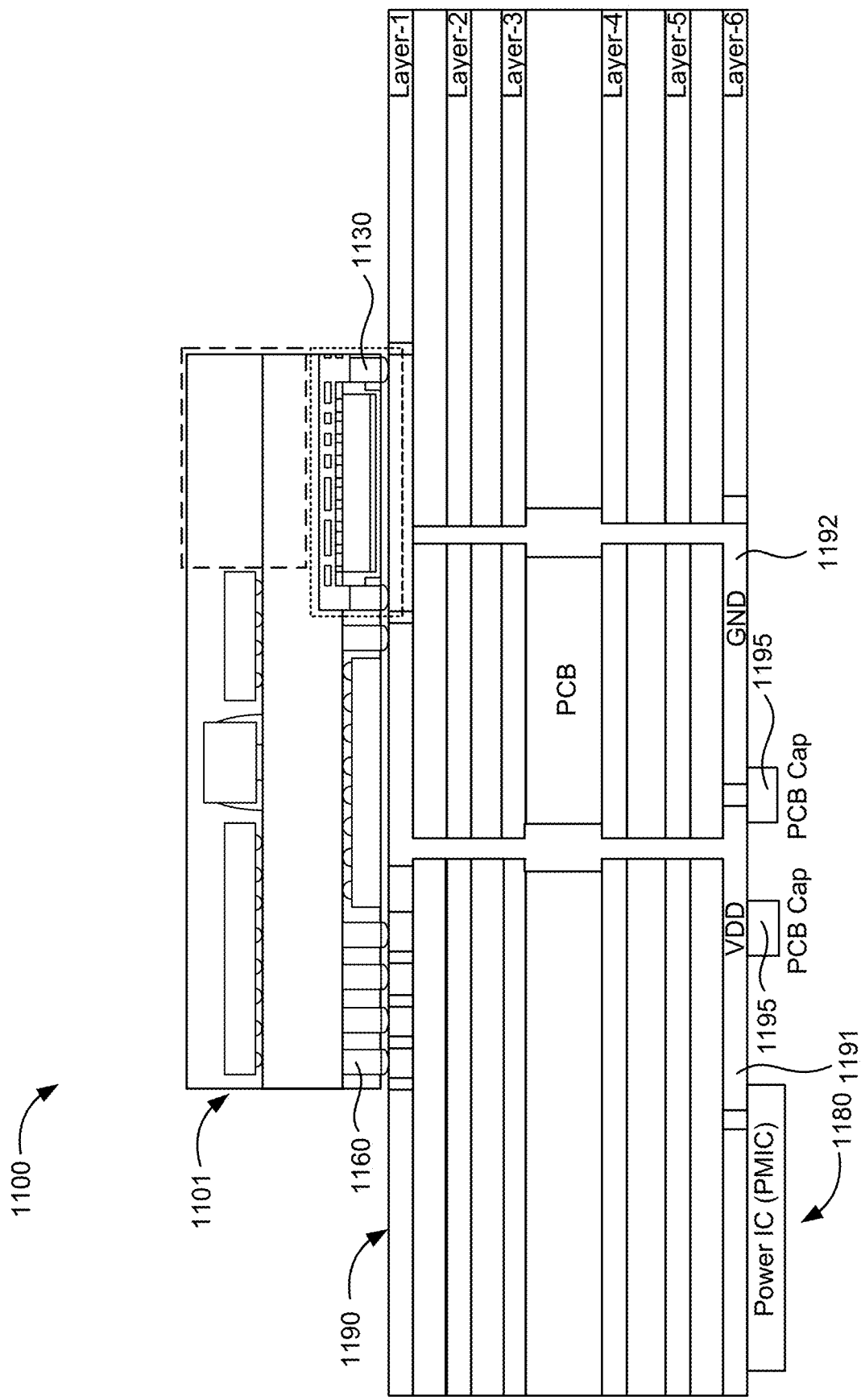
FIG. 11 illustrates components of an integrated device in accordance with one or more aspects of the disclosure.

FIG. 11 illustrates components of an integrated device 1100 according to one or more aspects of the disclosure. Regardless of the various configurations of the SiPs (e.g., 100, 200, 300, 400, etc.) discussed above, it will be appreciated that the SiP 1101 may be configured to couple the SiP 1101 to a PCB 1190, which may provide heat sinking through heat sink interconnects 1130. In some aspects, the heat sinking may also be provided through one or more signal interconnects 1160 coupled to ground (GND). However, in other aspects, the heat sink interconnects 1130 may be coupled to any structure, which may be at a ground or other potential, so long as the structure provides for a heat sinking function. The PCB 1190 is also coupled to a power supply 1180 (e.g., a power management integrated circuit (PMIC)), which allows the package SiP 1101 to be electrically coupled to the PMIC 1180. Specifically, one or more power supply (VDD) lines 1191 and one or more ground (GND) lines 1192 may be coupled to the PMIC 1180 to distribute power to the PCB 1190, SiP 1101 through signal interconnects 1160 and/or heat sink interconnects 1130. The VDD line 1191 and GND line 1192 each may be formed from traces, shapes, or patterns in one or more metal layers of the PCB 1190 (e.g., layers 1-6) coupled by one or more vias through insulating layers separating the metal layers 1-6 in the PCB 1190. The PCB 1190 may have one or more PCB capacitors (PCB cap) 1195 that can be used to condition the power supply signals, as is known to those skilled in the art. Additional connections and devices may be coupled to and/or pass through the PCB 1190 to the SiP 1101 via one or more signal interconnects 1160. It will be appreciated that the illustrated configuration and descriptions are provided merely to aid in the explanation of the various aspects disclosed herein. For example, the PCB 1190 may have more or less metal layers and insulating layers, may be cored or coreless, there may be multiple lines providing power to the various components, etc. Accordingly, the forgoing illustrative examples and associated figures should not be construed to limit the various aspects disclosed and claimed herein In accordance with the various aspects disclosed herein, at least one aspect includes an apparatus (e.g., SiP 100, 200, 300, 400, etc.) including: a high-power die (e.g., 110, 210, 310, 410, etc.) on a backside of a package substrate (e.g., 140, 240, 340, 440, etc.). A heat transfer layer (e.g., 120, 220, 320, 420, etc.) is disposed on the backside of the high-power die (e.g., 110, 210, 310, 410, etc.). A plurality of heat sink interconnects (e.g., 130, 230, 330, 430, etc.) is coupled to the heat transfer layer (e.g., 120, 220, 320, 420, etc.). The various aspects disclosed provide, in at least some aspects various technical advantages, such as the feature(s) of the high-power die being mounted to the backside of the package substrate to provide improved heat transfer using heat sink interconnects from the high-power die and SiP to an external component (e.g., to a PCB). Additionally, the location of the high-power die on the backside of the package substrate provides for improved utilization of the metal layers and routing in the package substrate in the freed up space above the high power die. Further, since the heatsink interconnects provide a short thermal path from the high-power die away from the package substrate, heating in the package substrate is also reduced. Other technical advantages will be recognized from various aspects disclosed herein and these technical advantages are merely provided as examples and should not be construed to limit any of the various aspects disclosed herein.

Figure 12:
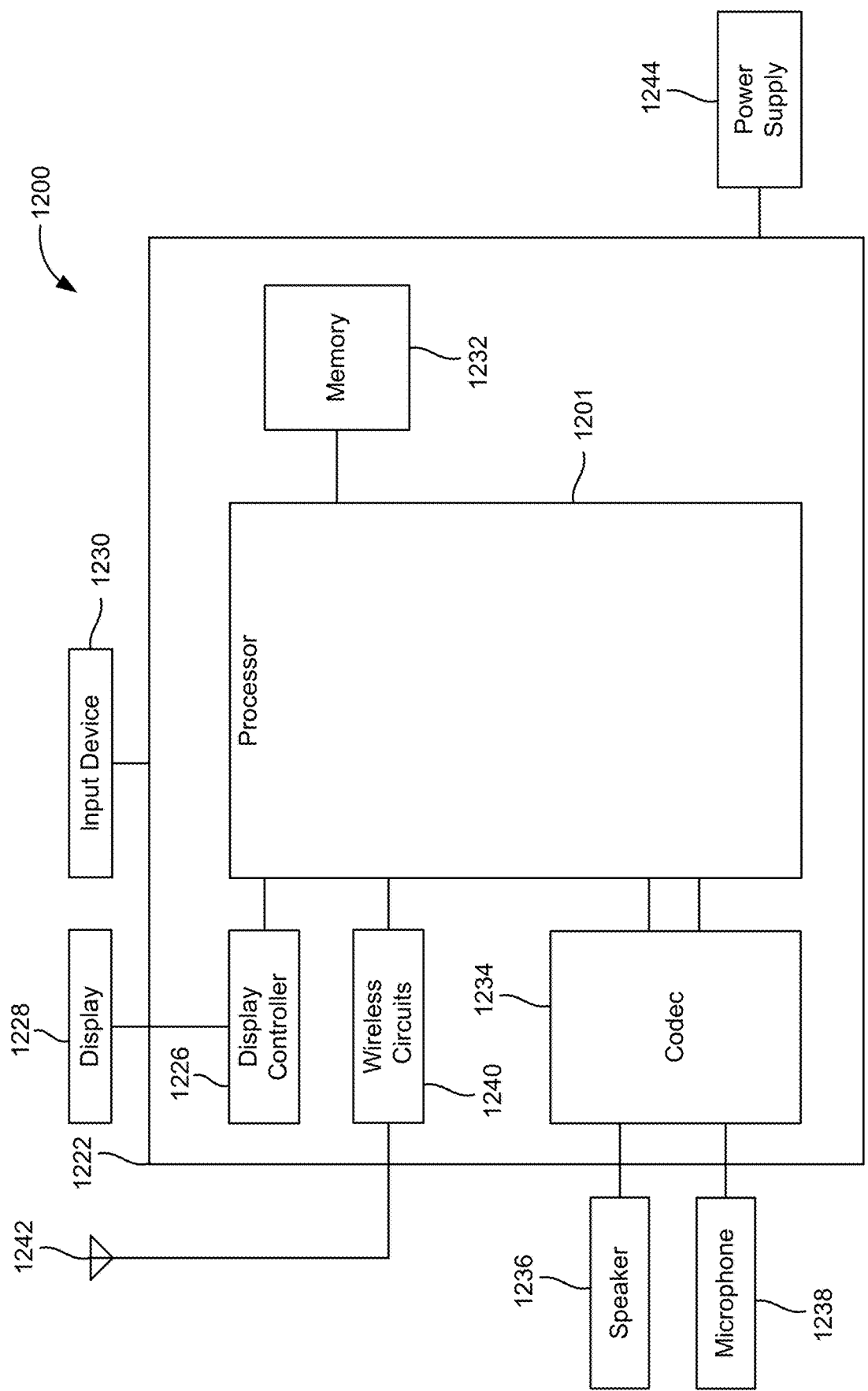
FIG. 12 illustrates an exemplary mobile device in accordance with one or more aspects of the disclosure.

FIG. 12 illustrates an exemplary mobile device in accordance with some examples of the disclosure. Referring now to FIG. 12, a block diagram of a mobile device that is configured according to exemplary aspects is depicted and generally designated mobile device 1200. In some aspects, mobile device 1200 may be configured as a wireless communication device. As shown, mobile device 1200 includes processor 1201. Processor 1201 may be communicatively coupled to memory 1232 over a link, which may be a die-to-die or chip-to-chip link. Mobile device 1200 also includes display 1228 and display controller 1226, with display controller 1226 coupled to processor 1201 and to display 1228.

In some aspects, FIG. 12 may include coder/decoder (CODEC) 1234 (e.g., an audio and/or voice CODEC) coupled to processor 1201; speaker 1236 and microphone 1238 coupled to CODEC 1234; and wireless circuits 1240 (which may include a modem, RF circuitry, filters, etc., which may be implemented using one or more SiPs (e.g., 100, 200, 300, 400, etc.), as disclosed herein) coupled to wireless antenna 1242 and to processor 1201.

In a particular aspect, where one or more of the above-mentioned blocks are present, processor 1201, display controller 1226, memory 1232, CODEC 1234, and wireless circuits 1240 can be included in a system-in-package or system-on-chip device 1222 which may be implemented in whole or part using the designs and fabrication techniques disclosed herein. Input device 1230 (e.g., physical, or virtual keyboard), power supply 1244 (e.g., battery), display 1228, input device 1230, speaker 1236, microphone 1238, wireless antenna 1242, and power supply 1244 may be external to system-on-chip device 1222 and may be coupled to a component of system-on-chip device 1222, such as an interface or a controller.

It should be noted that although FIG. 12 depicts a mobile device 1200, processor 1201 and memory 1232 and wireless circuits 1240 may also be integrated into different types of devices, which may have more or less components, as will be appreciated by those skilled in the art. For example, display controller 1226, display 1228 and CODEC 1234 may not be used in various devices. In addition to the mobile device, it will be appreciated the various aspects disclosed can be integrated into devices such as a set top box, a music player, a video player, an entertainment unit, a navigation device, a personal digital assistant (PDA), a fixed location data unit, a computer, a laptop, a tablet, a communications device, a server, a mobile phone, or other similar devices.

Figure 13:
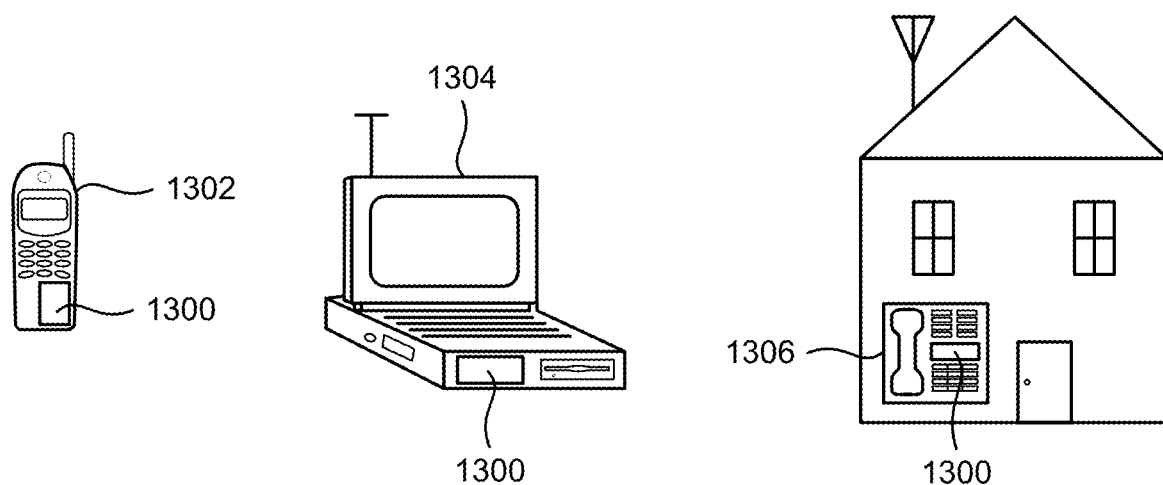
FIG. 13 illustrates various electronic devices that may be integrated with any of the aforementioned devices in accordance with one or more aspects of the disclosure.

FIG. 13 illustrates various electronic devices that may be integrated with any of the aforementioned integrated or SiP devices, in accordance with various examples of the disclosure. For example, a mobile phone device 1302, a laptop computer device 1304, and a fixed location terminal device 1306 may each be considered generally user equipment (UE) and may include a SiP device 1300 as described herein. The SiP device 1300 may be, for example, any of the integrated circuits, dies, integrated devices, integrated device packages, integrated circuit devices, device packages, integrated circuit (IC) packages, package-on-package devices described herein. The devices 1302, 1304, 1306 illustrated in FIG. 13 are merely exemplary. Other electronic devices may also feature the SiP device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1A-13 may be rearranged and/or combined into a single component, process, feature, or function or incorporated in several components, processes, or functions. Additional elements, components, processes, and/or functions may also be added without departing from the disclosure. It should also be noted that FIGS. 1A-13 and corresponding description in the present disclosure are not limited to dies and/or ICs. In some implementations, FIGS. 1A-13 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising: a high-power die mounted on a backside of a package substrate; a heat transfer layer disposed on the backside of the high-power die; and a plurality of heat sink interconnects coupled to the heat transfer layer, wherein each of the plurality of heat sink interconnects is directly coupled to the heat transfer layer in a vertical orientation.

Clause 2. The apparatus of clause 1, wherein the high-power die is an acoustic wave die or a power amplifier.

Clause 3. The apparatus of any of clauses 1 to 2, further comprising: a heat spreader disposed in the package substrate, wherein the heat spreader is coupled to a plurality of frontside contacts of the high-power die.

Clause 4. The apparatus of clause 3, wherein the heat spreader comprises a plurality of metal layers of the package substrate.

Clause 5. The apparatus of any of clauses 3 to 4, wherein the heat spreader is coupled to the plurality of heat sink interconnects or a plurality of signal interconnects coupled to ground.

Clause 6. The apparatus of any of clauses 1 to 5, wherein the plurality of heat sink interconnects is coupled to a ground.

Clause 7. The apparatus of any of clauses 1 to 6, wherein the high-power die further comprises: a plurality of heat sink vias extending from the heat transfer layer into the high-power die.

Clause 8. The apparatus of any of clauses 1 to 7, further comprising: at least one other die or surface mount device coupled to a front side of the package substrate, wherein the at least one other die or surface mount device is electrically coupled to the high-power die through the package substrate.

Clause 9. The apparatus of any of clauses 1 to 8, wherein the plurality of heat sink interconnects, each has a generally columnar shape.

Clause 10. The apparatus of any of clauses 1 to 9, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, access point, base station, small cell device and a device in an automotive vehicle.

Clause 11. The apparatus of any of clauses 1 to 10, further comprising: a plurality of signal interconnects disposed around a periphery of the high-power die, wherein the plurality of heat sink interconnects is located inside the plurality of signal interconnects.

Clause 12. The apparatus of any of clauses 1 to 11, wherein each of the plurality of heat sink interconnects comprise: a metal pillar; a compressible pad; and a solder portion coupled to metal pillar.

Clause 13. The apparatus of clause 12, wherein the metal pillar is copper.

Clause 14. The apparatus of any of clauses 12 to 13, further comprising: a mold compound configured to encapsulate the high-power die, the heat transfer layer and a portion of each of the plurality of heat sink interconnects.

Clause 15. The apparatus of any of clauses 12 to 14, further comprising: a mold compound configured to encapsulate the high-power die and a portion of the heat transfer layer, wherein a backside of the heat transfer layer and the plurality of heat sink interconnects are exposed from the mold compound.

Clause 16. The apparatus of any of clauses 12 to 15, wherein the compressible pad comprises a polymer pad enclosed by metal.

Clause 17. The apparatus of any of clauses 12 to 16, wherein the compressible pad extends beyond a diameter of the metal pillar.

Clause 18. The apparatus of any of clauses 1 to 17, wherein each of the plurality of heat sink interconnects comprise: a compressible metal pillar; and a solder portion coupled to the compressible metal pillar.

Clause 19. The apparatus of clause 18, wherein the compressible metal pillar comprises a porous metal that has a porosity of at least 4%.

Clause 20. The apparatus of clause 19, wherein the porosity is in a range of 5 percent to 40 percent.

Clause 21. The apparatus of any of clauses 18 to 20, wherein the compressible metal pillar comprises a copper nano paste or a transient liquid phase sintering paste.

Clause 22. The apparatus of any of clauses 1 to 21, wherein at least a portion of a backside of the heat transfer layer is covered by a solder resist and the plurality of heat sink interconnects extend through openings in the solder resist.

Clause 23. The apparatus of clause 22, further comprising: a printed circuit board (PCB) having a plurality of compressible contacts coupled to the high-power die through the plurality of heat sink interconnects.

Clause 24. The apparatus of clause 23, wherein each of the plurality of compressible contacts further comprise: a compressible pad coupled to the PCB and a metal pillar, wherein the metal pillar is coupled to an associated heat sink interconnect.

Clause 25. The apparatus of clause 24, wherein the compressible pad comprises a polymer pad enclosed by metal.

Clause 26. The apparatus of any of clauses 23 to 25, wherein each of the plurality of compressible contacts further comprise: a compressible pad embedded in the PCB and covered by a solder resist, wherein the compressible pad is coupled to an associated heat sink interconnect.

Clause 27. The apparatus of clause 26, wherein the compressible pad comprises a porous conductive material.

Clause 28. The apparatus of clause 27, wherein the porous conductive material has a porosity of at least 4%.

Clause 29. The apparatus of clause 28, wherein the porosity is in a range of 5 percent to 40 percent.

Clause 30. The apparatus of any of clauses 24 to 29, wherein the compressible pad comprises a copper nano paste or a transient liquid phase sintering paste.

Clause 31. A method for fabricating an apparatus comprising: mounting a high-power die on a backside of a package substrate; depositing a heat transfer layer on the backside of the high-power die; and forming a plurality of heat sink interconnects coupled to the heat transfer layer, wherein each of the plurality of heat sink interconnects is directly coupled to the heat transfer layer in a vertical orientation.

Clause 32. The method of clause 31, further comprising: forming a plurality of signal interconnects disposed around a periphery of the high-power die, wherein the plurality of heat sink interconnects is located inside the plurality of signal interconnects.

Clause 33. The method of any of clauses 31 to 32, wherein forming each of the plurality of heat sink interconnects comprise: forming a metal pillar; forming a compressible pad; and forming a solder portion coupled to metal pillar.

Clause 34. The method of clause 33, further comprising: encapsulating the high-power die, the heat transfer layer and a portion of each of the plurality of heat sink interconnects in a mold compound.

Clause 35. The method of any of clauses 33 to 34, further comprising: encapsulating the high-power die, and a portion of the heat transfer layer, in a mold compound, wherein a backside of the heat transfer layer and the plurality of heat sink interconnects are exposed from the mold compound.

Clause 36. The method of any of clauses 33 to 35, wherein the compressible pad comprises a polymer pad enclosed by metal.

Clause 37. The method of any of clauses 33 to 36, wherein the compressible pad extends beyond a diameter of the metal pillar.

Clause 38. The method of any of clauses 31 to 37, wherein forming each of the plurality of heat sink interconnects comprises: forming a compressible metal pillar; and depositing a solder portion on the compressible metal pillar.

Clause 39. The method of clause 38, wherein the compressible metal pillar comprises a copper nano paste or a transient liquid phase sintering paste.

Clause 40. The method of any of clauses 31 to 39, further comprising: covering a backside of the heat transfer layer with a solder resist; and forming the plurality of heat sink interconnects in openings in the solder resist.

Clause 41. The method of clause 40, further comprising: coupling a printed circuit board (PCB) having a plurality of compressible contacts to the high-power die through the plurality of heat sink interconnects.

Clause 42. The method of clause 41, wherein forming each of the plurality of compressible contacts comprises: forming a compressible pad coupled to the PCB and a metal pillar, wherein the metal pillar is coupled to an associated heat sink interconnect.

Clause 43. The method of clause 42, wherein the compressible pad comprises a polymer pad enclosed by metal.

Clause 44. The method of any of clauses 41 to 43, forming each of the plurality of compressible contacts comprises: forming a compressible pad embedded in the PCB; covering the compressible pad by a solder resist; and forming an opening in the solder resist, where the compressible pad is coupled to an associated heat sink interconnect via the opening in the solder resist.

Clause 45. The method of clause 44, wherein the compressible pad comprises a porous conductive material.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising:
a high-power die mounted on a backside of a package substrate;

a heat transfer layer disposed on the backside of the high-power die; and a plurality of heat sink interconnects coupled to the heat transfer layer, wherein each of the plurality of heat sink interconnects is directly coupled to the heat transfer layer in a vertical orientation, wherein the plurality of heat sink interconnects are disposed below the high-power die.

2. The apparatus of claim 1, wherein the high-power die is an acoustic wave die or a power amplifier.

3. The apparatus of claim 1, further comprising:
a heat spreader disposed in the package substrate, wherein the heat spreader is coupled to a plurality of frontside contacts of the high-power die.

4. The apparatus of claim 3, wherein the heat spreader comprises a plurality of metal layers of the package substrate.

5. The apparatus of claim 3, wherein the heat spreader is coupled to the plurality of heat sink interconnects or a plurality of signal interconnects coupled to ground.

6. The apparatus of claim 1, wherein the plurality of heat sink interconnects is coupled to a ground.

7. The apparatus of claim 1, wherein the high-power die further comprises:
a plurality of heat sink vias extending from the heat transfer layer into the high-power die.

8. The apparatus of claim 1, further comprising:
at least one other die or surface mount device coupled to a front side of the package substrate, wherein the at least one other die or surface mount device is electrically coupled to the high-power die through the package substrate.

9. The apparatus of claim 1, wherein the high-power die has a power dissipation rating of at least 0.25 Watts.

10. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, access point, base station, small cell device and a device in an automotive vehicle.

11. The apparatus of claim 1, further comprising:
a plurality of signal interconnects disposed around a periphery of the high-power die, wherein the plurality of heat sink interconnects is located inside the plurality of signal interconnects.

12. The apparatus of claim 1, wherein each of the plurality of heat sink interconnects comprise:
a metal pillar;
a compressible pad; and
a solder portion coupled to metal pillar.

13. The apparatus of claim 12, wherein the metal pillar is copper.

14. The apparatus of claim 12, further comprising:
a mold compound configured to encapsulate the high-power die, the heat transfer layer and a portion of each of the plurality of heat sink interconnects.

15. The apparatus of claim 12, further comprising:
a mold compound configured to encapsulate the high-power die and a portion of the heat transfer layer,
wherein a backside of the heat transfer layer and the plurality of heat sink interconnects are exposed from the mold compound.

16. The apparatus of claim 12, wherein the compressible pad comprises a polymer pad enclosed by metal.

17. The apparatus of claim 12, wherein the compressible pad extends beyond a diameter of the metal pillar.

18. The apparatus of claim 1, wherein each of the plurality of heat sink interconnects comprise:
a compressible metal pillar; and
a solder portion coupled to the compressible metal pillar.

19. The apparatus of claim 18, wherein the compressible metal pillar comprises a porous metal that has a porosity of at least 4%.

20. The apparatus of claim 19, wherein the porosity is in a range of 5 percent to 40 percent.

21. The apparatus of claim 18, wherein the compressible metal pillar comprises a copper nano paste or a transient liquid phase sintering paste.

22. The apparatus of claim 1, wherein at least a portion of a backside of the heat transfer layer is covered by a solder resist and the plurality of heat sink interconnects extend through openings in the solder resist.

23. The apparatus of claim 22, further comprising:
a printed circuit board (PCB) having a plurality of compressible contacts coupled to the high-power die through the plurality of heat sink interconnects.

24. The apparatus of claim 23, wherein each of the plurality of compressible contacts further comprise:
a compressible pad coupled to the PCB and a metal pillar, wherein the metal pillar is coupled to an associated heat sink interconnect.

25. The apparatus of claim 24, wherein the compressible pad comprises a polymer pad enclosed by metal.

26. The apparatus of claim 23, wherein each of the plurality of compressible contacts further comprise:
a compressible pad embedded in the PCB and covered by a solder resist, wherein the compressible pad is coupled to an associated heat sink interconnect.

27. The apparatus of claim 26, wherein the compressible pad comprises a porous conductive material.

28. The apparatus of claim 27, wherein the porous conductive material has a porosity of at least 4%.

29. The apparatus of claim 28, wherein the porosity is in a range of 5 percent to 40 percent.

30. The apparatus of claim 24, wherein the compressible pad comprises a copper nano paste or a transient liquid phase sintering paste.

* * * * *

UNITED STATES PATENT AND TRADEMARK OFFICE
CERTIFICATE OF CORRECTION

| | |
|---|---|
| PATENT NO. | : 11,929,299 B2 |
| APPLICATION NO. | : 17/313412 |
| DATED | : March 12, 2024 |
| INVENTOR(S) | : Jose Moreira et al. |

Page 1 of 1

It is certified that error appears in the above-identified patent and that said Letters Patent is hereby corrected as shown below:

On the Title Page

Item [73], 'QUALCOMM INCORPORATED' should be changed to -- QUALCOMM Technologies, Inc. and RF360 Europe GmbH --

Signed and Sealed this
Twenty-first Day of January, 2025

Coke Morgan Stewart
*Acting Director of the United States Patent and Trademark Office*